(12) United States Patent
Yoon et al.

(10) Patent No.: US 11,056,162 B2
(45) Date of Patent: Jul. 6, 2021

(54) MEMORY DEVICE AND METHOD OF OPERATING THE SAME

(71) Applicant: SK hynix Inc., Gyeonggi-do (KR)

(72) Inventors: Mi Sun Yoon, Gyeonggi-do (KR); Dong Hyuk Chae, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/857,877

(22) Filed: Apr. 24, 2020

(65) Prior Publication Data

US 2021/0166741 A1 Jun. 3, 2021

(30) Foreign Application Priority Data

Dec. 2, 2019 (KR) .......................... 10-2019-0158488

(51) Int. Cl.
*G11C 7/10* (2006.01)
*G11C 7/12* (2006.01)
*G11C 7/22* (2006.01)
*G11C 7/06* (2006.01)

(52) U.S. Cl.
CPC ................ *G11C 7/12* (2013.01); *G11C 7/065* (2013.01); *G11C 7/106* (2013.01); *G11C 7/1057* (2013.01); *G11C 7/1084* (2013.01); *G11C 7/1087* (2013.01); *G11C 7/22* (2013.01)

(58) Field of Classification Search
CPC ......... G11C 7/12; G11C 7/065; G11C 7/1057; G11C 7/106; G11C 7/1084; G11C 7/1087; G11C 7/22

USPC .................................................... 365/189.011
See application file for complete search history.

(56) References Cited

U.S. PATENT DOCUMENTS

| | | | |
|---|---|---|---|
| 7,123,521 B1 * | 10/2006 | Louie | G11C 7/1042 365/189.05 |
| 9,368,166 B2 * | 6/2016 | Kwak | G11C 7/10 |
| 9,842,654 B2 * | 12/2017 | Lee | G11C 11/5642 |
| 2014/0204684 A1 * | 7/2014 | Kwak | G11C 7/22 365/189.05 |
| 2017/0011799 A1 * | 1/2017 | Lee | G11C 16/24 |
| 2020/0227120 A1 * | 7/2020 | Lin | G11C 11/4091 |

FOREIGN PATENT DOCUMENTS

KR 10-0626371 9/2006
KR 10-2016-0074929 6/2016

* cited by examiner

*Primary Examiner* — Xiaochun L Chen
(74) *Attorney, Agent, or Firm* — IP & T Group LLP

(57) ABSTRACT

Provided herein is a memory device and a method of operating the same. The memory device may include a memory cell array including a plurality of memory cells, page buffers coupled to the memory cell array through respective bit lines and a control logic configured to control so that, during a read operation, data stored in the memory cell array is sensed and stored in the page buffers, and the data stored in the page buffers is output to an external device, wherein the control logic controls a time point at which a discharge operation is to be performed after the sensing of the data, and a time point at which a data transfer operation between latches included in each of the page buffers is to be performed, in response to a read command received from the external device.

20 Claims, 18 Drawing Sheets

MEMORY DEVICE AND METHOD OF OPERATING THE SAME

CROSS-REFERENCE TO RELATED APPLICATION

The present application claims priority under 35 U.S.C. § 119(a) to Korean patent application number 10-2019-0158488, filed on Dec. 2, 2019, which is incorporated herein by reference in its entirety.

BACKGROUND

Field of Invention

Various embodiments of the present disclosure generally relate to an electronic device, and more particularly, to a memory device and a method of operating the memory device.

Description of Related Art

A storage device is a device which stores data under the control of a host device such as a computer, a smartphone, or a smartpad. Examples of the storage device include a device such as a hard disk drive (HDD) which stores data in a magnetic disk, and a device such as a solid state drive (SSD) or a memory card which stores data in a semiconductor memory, particularly, a nonvolatile memory, according to the device in which data is stored.

The storage device may include a memory device in which data is stored and a memory controller which controls the storage of data in the memory device. Such memory devices may be classified into a volatile memory and a nonvolatile memory. Representative examples of the nonvolatile memory include a read only memory (ROM), a programmable ROM (PROM), an electrically programmable ROM (EPROM), an electrically erasable programmable ROM (EEPROM), a flash memory, a phase-change random access memory (PRAM), a magnetic RAM (MRAM), a resistive RAM (RRAM), and a ferroelectric RAM (FRAM).

SUMMARY

Various embodiments of the present disclosure are directed to a memory device and a method of operating the memory device, which can simultaneously perform a discharge operation and a data transfer operation after data sensing has been performed.

An embodiment of the present disclosure may provide for a memory device. The memory device may include a memory cell array including a plurality of memory cells, page buffers coupled to the memory cell array through respective bit lines and a control logic configured to control so that, during a read operation, data stored in the memory cell array is sensed and stored in the page buffers, and the data stored in the page buffers is output to an external device, wherein the control logic controls a time point at which a discharge operation is to be performed after the sensing of the data, and a time point at which a data transfer operation between latches included in each of the page buffers is to be performed, in response to a read command received from the external device.

An embodiment of the present disclosure may provide for a method of operating a memory device, the memory device including a memory cell array including a plurality of memory cells and page buffers coupled to the memory cell array through respective bit lines. The method may include, when the memory device performs a cache read operation, sensing data stored in the memory cell array and storing sensed data in a main latch between the main latch and a cache latch included in each of the page buffers, when the memory device performs a cache read operation, determining, after all of the sensed data has been stored in the main latch, whether a cache read command has been received from an external device and determining a time point at which a discharge operation is to be performed after the sensing of the data and a time point at which a data transfer operation of transferring the data stored in the main latch to the cache latch is to be performed, based on whether the cache read command has been received.

An embodiment of the present disclosure may provide for a memory device. The memory device may include a memory cell array, a peripheral circuit suitable for discharging the memory cell array during a cache read operation, a main latch suitable for latching read data sensed from the memory cell array, a cache latch suitable for latching read data transferred from the main latch to output the read data to an external and a control logic suitable for transferring the read data from the main latch to the cache latch during a discharge in response to a cache read command provided before or during the discharge.

DETAILED DESCRIPTION

Specific structural or functional descriptions in the embodiments of the present disclosure introduced in this specification or application are only for description of the embodiments of the present disclosure. The descriptions should not be construed as being limited to the embodiments described in the specification or application.

Various embodiments of the present disclosure will now be described more fully hereinafter with reference to the accompanying drawings, so that those of ordinary skill in the art can easily carry out the technical idea of the present disclosure.

Figure 1:
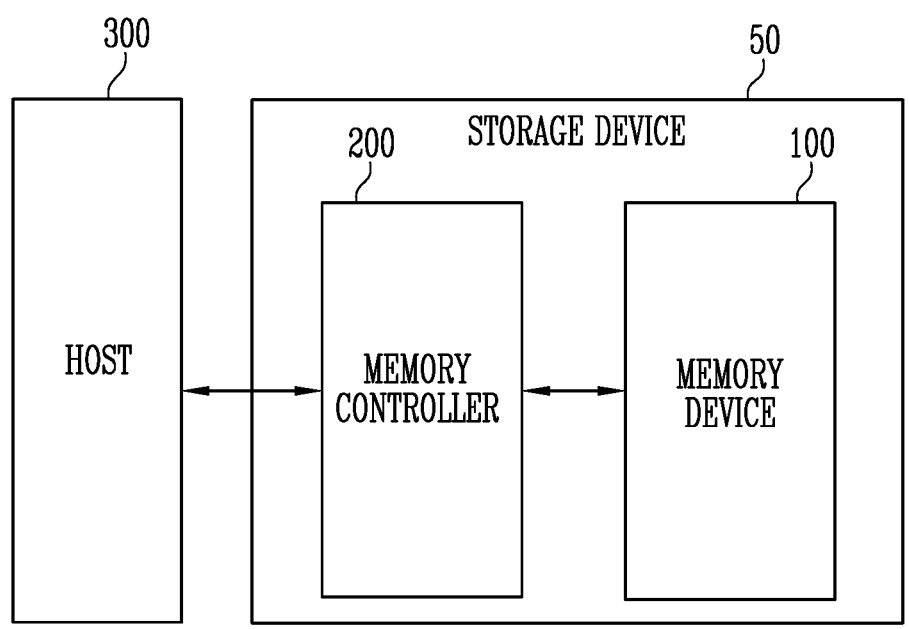
FIG. 1 is a block diagram illustrating a storage device.

FIG. 1 is a block diagram illustrating a storage device.

Referring to FIG. 1, a storage device 50 may include memory devices 100 and a memory controller 200.

The storage device 50 may be a device which stores data under the control of a host 300, such as for example, a mobile phone, a smartphone, an MP3 player, a laptop computer, a desktop computer, a game console, a television (TV), a tablet PC, or an in-vehicle infotainment system.

The storage device 50 may be manufactured as any one of various types of storage devices depending on a host interface that is a scheme for communication with the host 300. For example, the storage device 50 may be implemented as any one of various types of storage devices, for example, a solid state disk (SSD), a multimedia card such as an MMC, an embedded MMC (eMMC), a reduced size MMC (RS-MMC), or a micro-MMC, a secure digital card such as an SD, a mini-SD, or a micro-SD, a universal storage bus (USB) storage device, a universal flash storage (UFS) device, a personal computer memory card international association (PCMCIA) card-type storage device, a peripheral component interconnection (PCI)-card type storage device, a PCI express (PCI-E) card-type storage device, a compact flash (CF) card, a smart media card, and a memory stick.

The storage device 50 may be manufactured in any one of various types of package forms. For example, the storage device 50 may be manufactured in any one of various types of package forms, such as package on package (POP), system in package (SIP), system on chip (SOC), multi-chip package (MCP), chip on board (COB), wafer-level fabricated package (WFP), and wafer-level stack package (WSP).

The memory device 100 may store data. The memory device 100 is operated in response to the control of the memory controller 200. The memory device 100 may include a memory cell array including a plurality of memory cells which store data. The memory cell array may include a plurality of memory blocks. Each memory block may include a plurality of memory cells, which may constitute a plurality of pages. In an embodiment, each page may be a unit by which data is stored in the memory device 100 or by which data stored in the memory device 100 is read. A memory block may be a unit by which data is erased.

In an embodiment, the memory device 100 may take many alternative forms, such as a double data rate synchronous dynamic random access memory (DDR SDRAM), a low power double data rate fourth generation (LPDDR4) SDRAM, a graphics double data rate (GDDR) SDRAM, a low power DDR (LPDDR) SDRAM, a Rambus dynamic random access memory (RDRAM), a NAND flash memory, a vertical NAND flash memory, a NOR flash memory device, a resistive RAM (RRAM), a phase-change memory (PRAM), a magnetoresistive RAM (MRAM), a ferroelectric RAM (FRAM), or a spin transfer torque RAM (STT-RAM). In the present specification, for convenience of description, a description will be made based on the assumption that the memory device 100 is a NAND flash memory.

The memory device 100 may be implemented in a two-dimensional (2D) array structure or a three-dimensional (3D) array structure. Hereinafter, although a 3D array structure is described as an embodiment, the present disclosure is not limited to the 3D array structure. The present disclosure may also be applied not only to a flash memory device in which a charge storage layer is formed of a conductive floating gate (FG), but also to a charge trap flash (CTF) memory device in which a charge storage layer is formed of an insulating layer.

In an embodiment, the memory device 100 may be operated in a single-level cell (SLC) manner in which one data bit is stored in one memory cell. Alternatively, the memory device 100 may be operated in a manner in which at least two data bits are stored in one memory cell. For example, the memory device 100 may be operated in a multi-level cell (MLC) manner in which two data bits are stored in one memory cell, a triple-level cell (TLC) manner in which three data bits are stored in one memory cell, or a quadruple-level cell (QLC) manner in which four data bits are stored in one memory cell.

The memory device 100 may receive a command and an address from the memory controller 200, and may access the area of the memory cell array, selected by the address. That is, the memory device 100 may perform an operation corresponding to the command on the area selected by the address. For example, the memory device 100 may perform a write operation (i.e., program operation), a read operation or an erase operation in response to the received command. When a program command is received, the memory device 100 may program data to the area selected by the address. When a read command is received, the memory device 100 may read data from the area selected by the address. When an erase command is received, the memory device 100 may erase data stored in the area selected by the address.

In an embodiment, the memory device 100 may perform a cache read operation. The cache read operation, which is one of various read operations, denotes an operation of storing data, stored in the memory cell array, in a main latch while outputting data stored in a cache latch included in the page buffer. That is, data is successively stored in the main latch and the cache latch, and data stored in the cache latch is successively output, and thus the performance of the read operation may be improved.

During a conventional cache read operation, data corresponding to a read address is stored in the main latch, after which a selected word line to which a read voltage has been applied, unselected word lines, a power source, a pump, etc. are discharged. That is, for a next read operation, when read data is stored in the main latch, the word lines or the like may be discharged. When the discharge operation is completed, the memory device 100 transfers the data stored in the main latch to the cache latch.

That is, in conventional technology, when the discharge operation is completed after the read data has been stored in the main latch, that is, after data has been sensed, the memory device 100 transfers the data stored in the main latch to the cache latch. The reason for this is that the time consumed in the output of data is longer than the time consumed in operations involved in the read operation (e.g., a voltage apply time, a channel precharge time, a discharge time, etc.).

However, as the output speed of data increases, before the discharge operation is performed, all previous data stored in the cache latch may be output, and a new cache read command may be received. That is, the reception of the new cache read command may indicate that all of the data stored in the cache latch has been output. In detail, as the output speed of data increases, a time point at which a user requests data may become earlier than a time point at which an internal read operation is completed. In this case, an operation of transferring the data stored in the main latch to the cache latch and a discharge operation may be simultaneously performed, thus a data output time point may be advanced.

Therefore, in the present disclosure, depending on whether a cache read command has been received before a discharge operation, whether to transfer data from the main latch to the cache latch may be determined. When it is determined whether to transfer data from the main latch to the cache latch depending on whether the cache read command has been received, the time required for a read operation may be shortened.

For example, when the cache read command is received before a discharge operation, the data may be transferred from the main latch to the cache latch simultaneously with the discharge operation. Therefore, the time consumed in the read operation may be shortened by the time consumed in the discharge operation. However, when a cache read command is received after or during the discharge operation, data may be transferred from the main latch to the cache latch after the discharge operation has been completed.

The memory controller 200 may control the overall operation of the storage device 50.

When a supply voltage is applied to the storage device 50, the memory controller 200 may run firmware (FW). When the memory device 100 is a flash memory device 100, the memory controller 200 may run firmware such as a Flash Translation Layer (FTL) for controlling communication between the host 300 and the memory device 100.

In an embodiment, the memory controller 200 may include firmware (not illustrated) which may receive data and a logical block address (LBA) from the host 300, and may translate the logical block address (LBA) into a physical block address (PBA) indicating the address of memory cells which are included in the memory device 100 and in which data is to be stored. Further, the memory controller 200 may store a logical-physical address mapping table, which configures mapping relationships between logical block addresses (LBA) and physical block addresses (PBA), in the buffer memory.

The memory controller 200 may control the memory device 100 so that a program operation, a read operation or an erase operation is performed in response to a request received from the host 300. For example, when a program request is received from the host 300, the memory controller 200 may convert the program request into a program command, and may provide the program command, a physical block address (PBA), and data to the memory device 100. When a read request together with a logical block address is received from the host 300, the memory controller 200 may convert the read request into a read command, select a physical block address corresponding to the logical block address, and thereafter provide the read command and the physical block address (PBA) to the memory device 100. When an erase request together with a logical block address is received from the host 300, the memory controller 200 may convert the erase request into an erase command, select a physical block address corresponding to the logical block address, and thereafter provide the erase command and the physical block address (PBA) to the memory device 100.

In an embodiment, the memory controller 200 may autonomously generate a program command, an address, and data without receiving a request from the host 300, and may transmit the program command, address, and data to the memory device 100. For example, the memory controller 200 may provide commands, addresses, and data to the memory device 100 to perform background operations, such as a program operation for wear leveling and a program operation for garbage collection.

In an embodiment, the storage device 50 may include a buffer memory (not illustrated). The memory controller 200 may control data exchange between the host 300 and the buffer memory (not illustrated). Alternatively, the memory controller 200 may temporarily store system data for controlling the memory device 100 in the buffer memory (not illustrated). For example, the memory controller 200 may temporarily store data, input from the host 300, in the buffer memory, and may then transmit the data, temporarily stored in the buffer memory, to the memory device 100.

In various embodiments, the buffer memory may be used as a working memory or a cache memory for the memory controller 200. The buffer memory may store codes or commands that are executed by the memory controller 200. Alternatively, the buffer memory may store data that is processed by the memory controller 200.

In an embodiment, the buffer memory may be implemented as a DRAM such as a double data rate SDRAM (DDR SDRAM), a double data rate fourth generation (DDR4) SDRAM, a low power double data rate fourth generation (LPDDR4) SDRAM, a graphics double data rate (GDDR) SDRAM, a low power DDR (LPDDR) SDRAM, or a Rambus DRAM (RDRAM), or as a static RAM (SRAM).

In various embodiments, the buffer memory may be coupled to the storage device 50 outside the storage device 50. In this case, volatile memory devices coupled to the outside of the storage device 50 may function as the buffer memory.

In an embodiment, the memory controller 200 may control at least two memory devices. In this case, the memory controller 200 may control the memory devices depending on an interleaving scheme to improve operating performance.

The host 300 may communicate with the storage device 50 using at least one of various communication methods, such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

Figure 2:
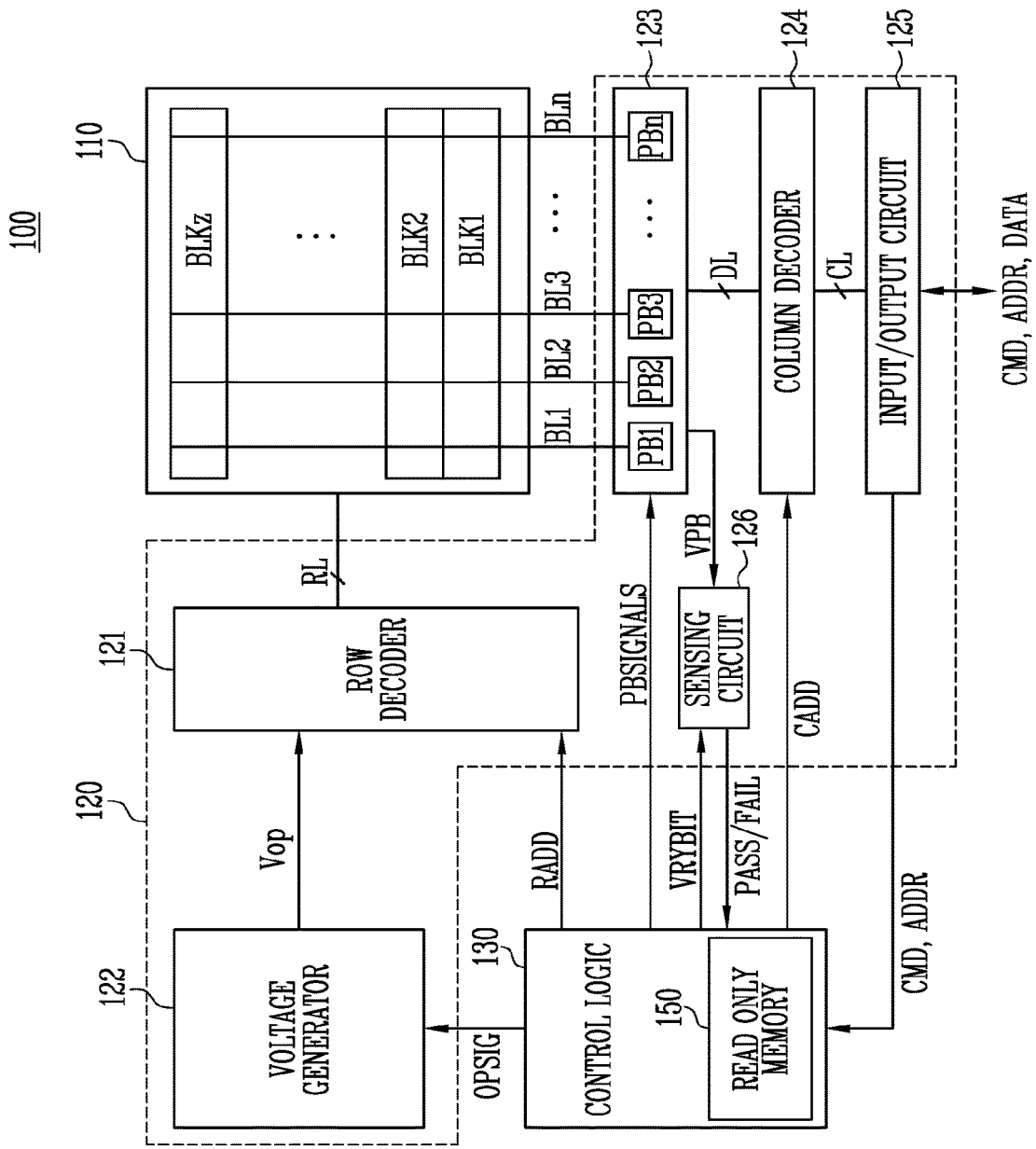
FIG. 2 is a diagram illustrating the structure of a memory device of FIG. 1.

FIG. 2 is a diagram illustrating the structure of the memory device of FIG. 1.

Referring to FIG. 2, the memory device 100 may include a memory cell array 110, a peripheral circuit 120, and a control logic 130.

The memory cell array 110 includes a plurality of memory blocks BLK1 to BLKz. The plurality of memory blocks BLK1 to BLKz are coupled to a row decoder 121 through row lines RL. Each of the memory blocks BLK1 to BLKz may be coupled to a page buffer group 123 through bit lines BL1 to BLn. Each of the memory blocks BLK1 to BLKz may include a plurality of memory cells. In an embodiment, the plurality of memory cells may be nonvolatile memory cells. Memory cells coupled to the same word line may be defined as a single page. Therefore, a single memory block may include a plurality of pages.

The row lines RL may include at least one source select line, a plurality of word lines, and at least one drain select line.

Each of the memory cells included in the memory cell array 110 may be implemented as a single-level cell (SLC) capable of storing one data bit, a multi-level cell (MLC) capable of storing two data bits, a triple-level cell (TLC) capable of storing three data bits, or a quadruple-level cell (QLC) capable of storing four data bits. However, the memory cells included in the memory cell array 110 are not limited to these embodiments, and is capable of storing any number of data bits depending on design.

The peripheral circuit 120 may perform a program operation, a read operation, or an erase operation on a selected area of the memory cell array 110 under the control of the control logic 130. The peripheral circuit 120 may drive the memory cell array 110. For example, the peripheral circuit 120 may apply various operating voltages to the row lines RL and the bit lines BL1 to BLn or discharge the applied voltages under the control of the control logic 130.

The peripheral circuit 120 may include the row decoder 121, a voltage generator 122, the page buffer group 123, a column decoder 124, an input/output circuit 125, and a sensing circuit 126.

The row decoder 121 is coupled to the memory cell array 110 through the row lines RL. The row lines RL may include the at least one source select line, the plurality of word lines, and the at least one drain select line. In an embodiment, the word lines may include normal word lines and dummy word lines. In an embodiment, the row lines RL may further include a pipe select line.

The row decoder 121 may decode a row address RADD received from the control logic 130. The row decoder 121 selects at least one of the memory blocks BLK1 to BLKz according to the decoded address. Further, the row decoder 121 may select at least one word line WL of the selected memory block so that voltages generated by the voltage generator 122 are applied to the at least one word line WL according to the decoded address.

For example, during a program operation, the row decoder 121 may apply a program voltage to a selected word line and apply a program pass voltage having a level lower than that of the program voltage to unselected word lines. During a program verify operation, the row decoder 121 may apply a verify voltage to a selected word line and apply a verify pass voltage higher than the verify voltage to unselected word lines. During a read operation, the row decoder 121 may apply a read voltage to a selected word line and apply a read pass voltage higher than the read voltage to unselected word lines.

In an embodiment, the erase operation of the memory device 100 is performed on a memory block basis. During an erase operation, the row decoder 121 may select one memory block according to the decoded address. During the erase operation, the row decoder 121 may apply a ground voltage to word lines coupled to the selected memory block.

The voltage generator 122 may be operated under the control of the control logic 130. The voltage generator 122 may generate a plurality of voltages using an external supply voltage provided to the memory device 100. In detail, the voltage generator 122 may generate various operating voltages Vop that are used for program, read, and erase operations in response to an operation signal OPSIG. For example, the voltage generator 122 may generate a program voltage, a verify voltage, a pass voltage, a read voltage, an erase voltage, etc. under the control of the control logic 130.

In an embodiment, the voltage generator 122 may generate an internal supply voltage by regulating the external supply voltage. The internal supply voltage generated by the voltage generator 122 is used as an operating voltage for the memory device 100.

In an embodiment, the voltage generator 122 may generate a plurality of voltages using the external supply voltage or the internal supply voltage.

For example, the voltage generator 122 may include a plurality of pumping capacitors for receiving the internal supply voltage and generate a plurality of voltages by selectively enabling the plurality of pumping capacitors under the control of the control logic 130.

The generated voltages may be supplied to the memory cell array 110 by the row decoder 121.

The page buffer group 123 includes first to nth page buffers PB1 to PBn. The first to nth page buffers PB1 to PBn are coupled to the memory cell array 110 through the first to nth bit lines BL1 to BLn. The first to nth page buffers PB1 to PBn are operated under the control of the control logic 130. In detail, the first to nth page buffers PB1 to PBn may be operated in response to page buffer control signals PBSIGNALS. For example, the first to nth page buffers PB1 to PBn may temporarily store data received through the first to nth bit lines BL1 to BLn or may sense voltages or currents of the bit lines BL1 to BLn during a read or verify operation.

In detail, during a program operation, when the program voltage is applied to the selected word line, the first to nth page buffers PB1 to PBn may transfer the data DATA, received through the input/output circuit 125, to selected memory cells through the first to nth bit lines BL1 to BLn. The memory cells in the selected page are programmed based on the received data DATA. During a program verify operation, the first to nth page buffers PB1 to PBn may read page data by sensing the voltages or currents received through the first to nth bit lines BL1 to BLn from the selected memory cells.

During a read operation, the first to nth page buffers PB1 to PBn may read data DATA from the memory cells in the selected page through the first to nth bit lines BL1 to BLn, and may output the read data DATA to the input/output circuit 125 under the control of the column decoder 124.

During the erase operation, the first to nth page buffers PB1 to PBn may allow the first to nth bit lines BL1 to BLn to float or may apply the erase voltage to the first to nth bit lines BL1 to BLn.

The column decoder 124 may transfer data between the input/output circuit 125 and the page buffer group 123 in response to a column address CADD. For example, the column decoder 124 may exchange data with the first to nth page buffers PB1 to PBn through data lines DL or may exchange data with the input/output circuit 125 through column lines CL.

The input/output circuit 125 may transfer a command CMD and an address ADDR, received from the memory controller (e.g., 200 of FIG. 1) described above with reference to FIG. 1, to the control logic 130, or may exchange data DATA with the column decoder 124.

During a read operation or a verify operation, the sensing circuit 126 may generate a reference current in response to an enable bit VRYBIT, and may compare a sensing voltage VPB received from the page buffer group 123 with a reference voltage generated by the reference current and then output a pass signal PASS or a fail signal FAIL.

The control logic 130 may control the peripheral circuit 120 by outputting the operation signal OPSIG, the row address RADD, the page buffer control signals PBSIGNALS, and the enable bit VRYBIT in response to the command CMD and the address ADDR. For example, the control logic 130 may control a read operation on a selected memory block in response to a sub-block read command and an address. Also, the control logic 130 may control an erase operation on a selected sub-block included in a selected memory block in response to a sub-block erase command and an address. In addition, the control logic 130 may determine whether a verify operation has passed or failed in response to the pass or fail signal PASS or FAIL.

The memory cells included in the memory cell array 110 may be programmed to any one of a plurality of program states depending on the data stored in each memory cell. A target program state of the corresponding memory cell may be determined to be any one of the plurality of program states depending on the data to be stored.

The control logic 130 may include a read only memory (ROM) 150. Codes for performing an operation on the memory device 100 may be stored in the read only memory 150. The read only memory 150 may output a code corresponding to a decoded signal of a command or an address.

For example, when a decoded signal corresponding to a normal read command or a cache read command is input to the read only memory 150, the read only memory 150 may output a code corresponding to the decoded signal.

In an embodiment, when the code corresponding to the decoded signal of the cache read command is output, the memory device 100 may transfer data stored in the main latch to the cache latch. Further, when the code corresponding to the decoded signal of the normal read command is output, the memory device 100 may transfer data stored in the memory cell array 110 to the main latch.

Figure 3:
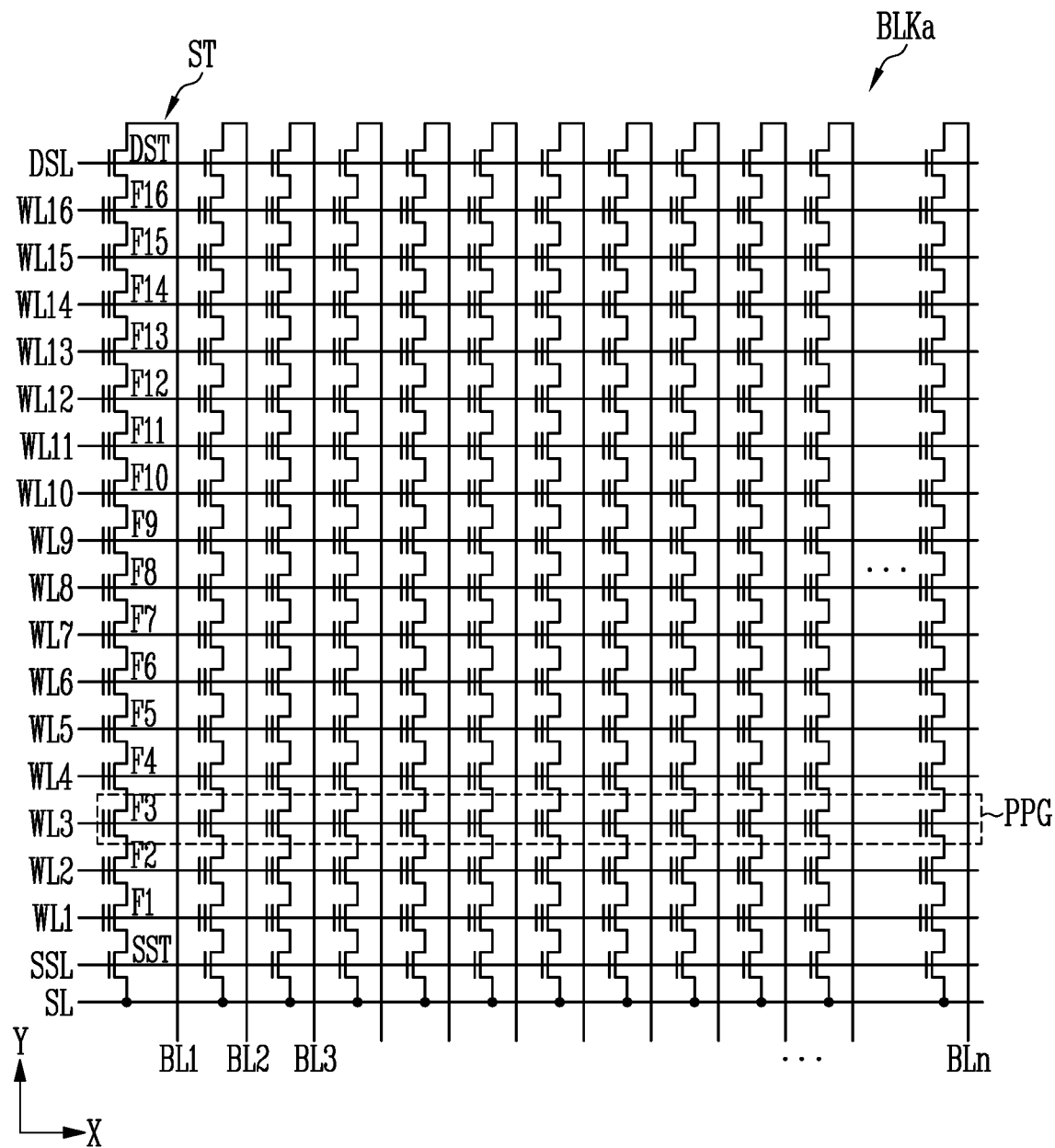
FIG. 3 is a diagram illustrating a memory block.

FIG. 3 is a diagram illustrating a memory block.

Referring to FIGS. 2 and 3, FIG. 3 is a circuit diagram illustrating any one memory block BLKa of a plurality of memory blocks BLK1 to BLKz included in the memory cell array 110 of FIG. 2.

The memory block BLKa may be coupled to a first select line, word lines, and a second select line that are coupled in parallel to each other. For example, the word lines may be coupled in parallel to each other between the first and second select lines. Here, the first select line may be a source select line SSL, and the second select line may be a drain select line DSL.

In detail, the memory block BLKa may include a plurality of strings coupled between bit lines BL1 to BLn and a source line SL. The bit lines BL1 to BLn may be coupled to the strings, respectively, and the source line SL may be coupled in common to the strings. Since the strings may be equally configured, a string ST coupled to the first bit line BL1 will be described in detail by way of example.

The string ST may include a source select transistor SST, a plurality of memory cells F1 to F16, and a drain select transistor DST which are coupled in series to each other between the source line SL and the first bit line BL1. A single string ST may include at least one source select transistor SST and at least one drain select transistor DST, and more memory cells than the memory cells F1 to F16 illustrated in the drawing may be included in the string ST.

A source of the source select transistor SST may be coupled to the source line SL, and a drain of the drain select transistor DST may be coupled to the first bit line BL1. The memory cells F1 to F16 may be coupled in series between the source select transistor SST and the drain select transistor DST. Gates of the source select transistors included in different strings ST may be coupled to the source select line SSL, gates of the drain select transistors included in different strings ST may be coupled to the drain select line DSL, and gates of the memory cells F1 to F16 may be coupled to a plurality of word lines WL1 to WL16, respectively. A group of memory cells coupled to the same word line, among the memory cells included in different strings ST, may be referred to as a "physical page: PPG". Therefore, the memory block BLKa may include a number of physical pages PPG identical to the number of word lines WL1 to WL16.

One memory cell may store one bit of data. This cell is typically designated as a "single-level cell: SLC". Here, one physical page PPG may store data corresponding to one logical page LPG. The data corresponding to one logical page LPG may include a number of data bits identical to the number of memory cells included in one physical page PPG. Alternatively, one memory cell may store two or more bits of data. This cell is typically designated as a "multi-level cell: MLC". Here, one physical page PPG may store data corresponding to two or more logical pages LPG.

A memory cell in which two or more bits of data are stored in one memory cell is called a multi-level cell (MLC). However, recently, as the number of data bits stored in one memory cell increases, the multi-level cell (MLC) refers to a memory cell in which two bits of data are stored, and thus a memory cell in which three bits of data are stored is called a triple-level cell (TLC) and a memory cell in which four bits of data are stored is called a quadruple-level cell (QLC). In addition, a memory cell scheme in which multiple bits of data are stored has been developed, and the present embodiment may be applied to the memory device 100 in which two or more bits of data are stored.

In an embodiment, each of the memory blocks may have a three-dimensional (3D) structure. Each of the memory blocks may include a plurality of memory cells stacked on a substrate. The plurality of memory cells are arranged in +X, +Y, and +Z directions.

Figure 4:
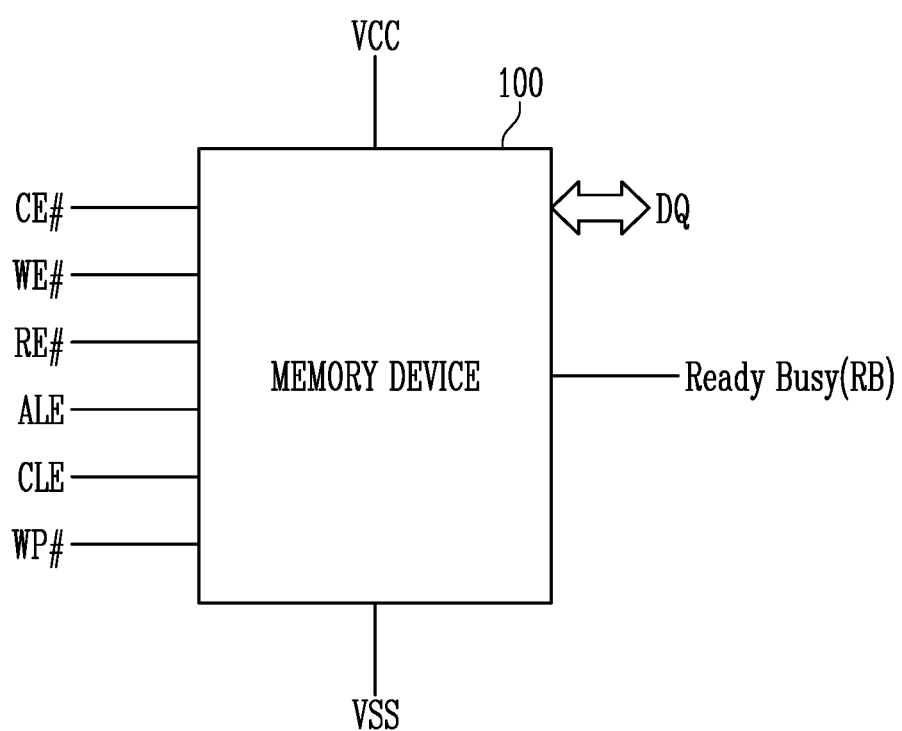
FIG. 4 is a diagram for describing the pin configuration of a memory device of FIG. 1.

FIG. 4 is a diagram for describing the pin configuration of a memory device of FIG. 1.

Referring to FIG. 4, the memory device 100 may communicate with an external controller through a plurality of input/output lines. For example, the memory device 100 may communicate with the external controller through control signal lines which include a chip enable line CE #, a write enable line WE #, a read enable line RE #, an address latch enable line ALE, a command latch enable line CLE, a write protect line WP #, and a ready busy line RB, and input/output lines DQ.

The memory device 100 may receive a chip enable signal from the external controller through the chip enable line CE #. The memory device 100 may receive a write enable signal from the external controller through the write enable line WE #. The memory device 100 may receive a read enable signal from the external controller through the read enable line RE #. The memory device 100 may receive an address latch enable signal from the external controller through the address latch enable line ALE. The memory device 100 may receive a command latch enable signal from the external controller through the command latch enable line CLE. The memory device 100 may receive a write protect signal from the external controller through the write protect line WP #.

In an embodiment, the memory device 100 may provide a ready busy signal, indicating whether the memory device 100 is in a ready state or in a busy state, to the external controller through the ready busy line RB.

The chip enable signal may be a control signal for selecting the memory device 100. When the chip enable signal is in a 'high' state and the memory device 100 is in a 'ready' state, the memory device 100 may enter a low-power standby state.

The write enable signal may be a control signal for performing control so that commands, addresses, and input data which are applied to the memory device are stored in a latch.

The read enable signal may be a control signal for enabling the output of serial data.

The address latch enable signal may be one of control signals used by the host to indicate which one of a command, an address, and data corresponds to the type of signal input to the input/output lines DQ.

The command latch enable signal may be one of control signals used by the host to indicate which one of a command, an address, and data corresponds to the type of signal input to the input/output lines DQ.

For example, when the command latch enable signal is activated (e.g., to a logic high state), the address latch enable signal is deactivated (e.g., to a logic low state), and the write enable signal is activated (e.g., to a logic low state) and then deactivated (e.g., to a logic high state), the memory device 100 may identify that the signal input through the input/output lines DQ is a command.

For example, when the command latch enable signal is deactivated (e.g., to a logic low state), the address latch enable signal is activated (e.g., to a logic high state), and the write enable signal is activated (e.g., to a logic low state) and then deactivated (e.g., to a logic high state), the memory device 100 may identify that the signal input through the input/output lines DQ is an address.

The write protect signal may be a control signal for deactivating the program operation and the erase operation that are performed by the memory device 100.

The ready busy signal may be a signal for identifying the status of the memory device 100. That is, the ready busy signal in a low state indicates that the memory device 100 is in a busy state, that is, that the memory device 100 is performing at least one operation. The ready busy signal in a high state indicates that the memory device 100 is in a ready state, that is, that the memory device 100 is performing no operation, and is then capable of receiving a command.

The ready busy signal may be in a low state while the memory device 100 is performing any one of a program operation, a read operation, and an erase operation. In an embodiment of the present disclosure, the memory controller 200, described with reference to FIG. 1, may determine a termination time which is the time at which the program operation or the erase operation is terminated based on the ready busy signal.

Figure 5:
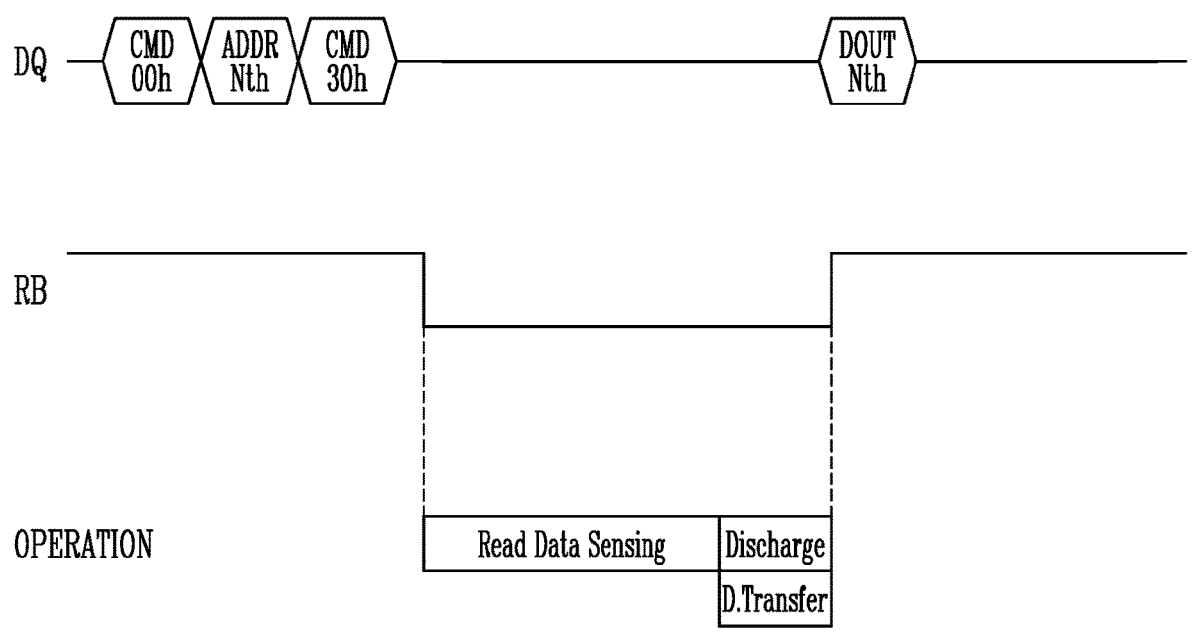
FIG. 5 is a diagram illustrating a normal read operation.

FIG. 5 is a diagram illustrating a normal read operation.

FIG. 5 illustrates a command and an address that are input through an input/output lines and data that is output through the input/output lines. Also, FIG. 5 illustrates a ready busy signal that is output through a ready busy line and an operation performed on a memory device in response to the ready busy signal.

In an embodiment, during a normal read operation, a command and an address may be input from a memory controller through the input/output lines DQ. During a normal read operation, a command 00h ("CMD 00h"), an Nth address ("ADDR Nth"), and a command 30h ("CMD 30h") are sequentially input through the input/output lines DQ.

Until all of the command 00h ("CMD 00h"), the Nth address ("ADDR Nth"), and the command 30h ("CMD 30h") are input from the memory controller through the input/output lines DQ, the memory device is in a state before an operation is performed, and thus the ready busy signal in a high state may be output.

When the command 30h ("CMD 30h") is input from the memory controller, the memory device may sense data corresponding to the Nth address ("ADDR Nth") ("Read Data Sensing"). For example, among pieces of data stored in the memory cell array included in the memory device, data corresponding to the Nth address ("ADDR Nth") may be stored in the main latch.

Here, since the memory device initiates an operation, the ready busy signal output through the ready busy line RB may be in a low state.

When the sensing of data corresponding to the Nth address ("ADDR Nth") ("Read Data Sensing") is completed, that is, when all of the data corresponding to the Nth address ("ADDR Nth") is stored in the main latch, the memory device may perform a discharge operation ("Discharge"). The discharge operation ("Discharge") may be an operation of resetting word lines, a pump, a power source, etc. The discharge operation may be performed to sense data corresponding to a next address.

In an embodiment, a data transfer operation ("D.Transfer") may be performed together with the discharge operation ("Discharge"). The data transfer operation ("D.Transfer") may be an operation of transferring the data stored in the main latch to the cache latch. In the case of a normal read operation, the discharge operation ("Discharge") and the data transfer operation ("D.Transfer") may overlap each other. That is, the discharge operation ("Discharge") and the data transfer operation ("D.Transfer") may be simultaneously performed.

During the normal read operation, since the output of data stored in the cache latch, and a data sensing operation of storing data stored in the memory cell array in the main latch, are not successively performed, there is no data stored in the cache latch during the data sensing operation, and thus the data stored in the main latch may be immediately stored in the cache latch.

Here, the ready busy signal that is output through the ready busy line RB may be in a low state until the data transfer operation ("D.Transfer") is completed.

In an embodiment, when the transfer of data from the main latch to the cache latch is completed, the memory device may output the data stored in the cache latch ("DOUT Nth"). Also, after the data transfer operation ("D.Transfer") has been completed, the ready busy signal that is output through the ready busy line RB may be in a high state.

Figure 6:
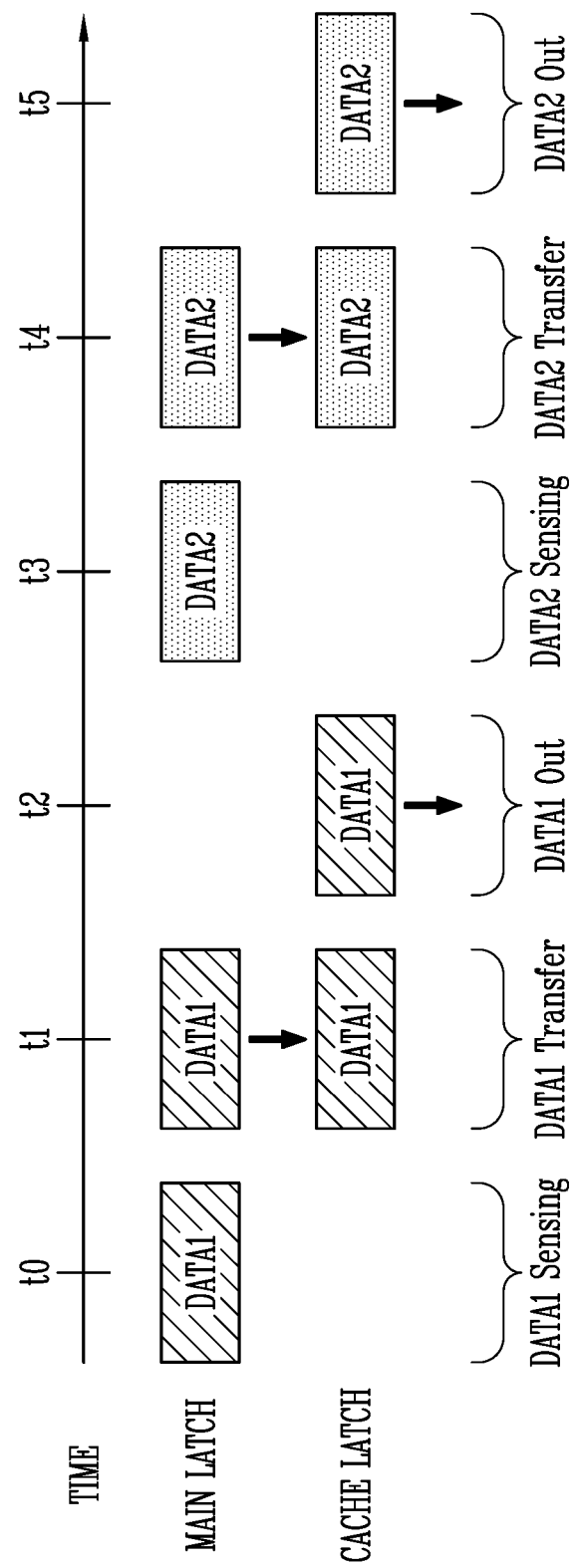
FIG. 6 is a diagram for describing the movement of data during a normal read operation.

FIG. 6 is a diagram for describing the movement of data during a normal read operation.

Referring to FIG. 6, FIG. 6 illustrates the movement of data between a main latch and a cache latch included in any one of first to nth page buffers PB1 to PBn included in a page buffer group during the normal read operation of a memory device in time sequence.

At time t0, first data DATA1 corresponding to an address received together with a normal read command may be stored in the main latch. That is, the operation of sensing the first data DATA1 may be performed ("DATA1 Sensing").

When all of the first data DATA1 is stored in the main latch, the first data DATA1 stored in the main latch may be transferred to the cache latch at time t1 ("DATA1 Transfer"). At time t2, the first data DATA1 stored in the cache latch may be output to the memory controller ("DATA1 Out").

In an embodiment, at time t3 after the first data DATA1 has been output to the memory controller, second data DATA2 corresponding to a next read command and a next address that are received from the memory controller may be sensed and stored in the main latch ("DATA2 Sensing").

When all of the second data DATA2 is stored in the main latch, the second data DATA2 stored in the main latch may be transferred to the cache latch at time t4 ("DATA2 Transfer"). At time t5, the second data DATA2 stored in the cache latch may be output to the memory controller ("DATA2 Out").

Figure 7:
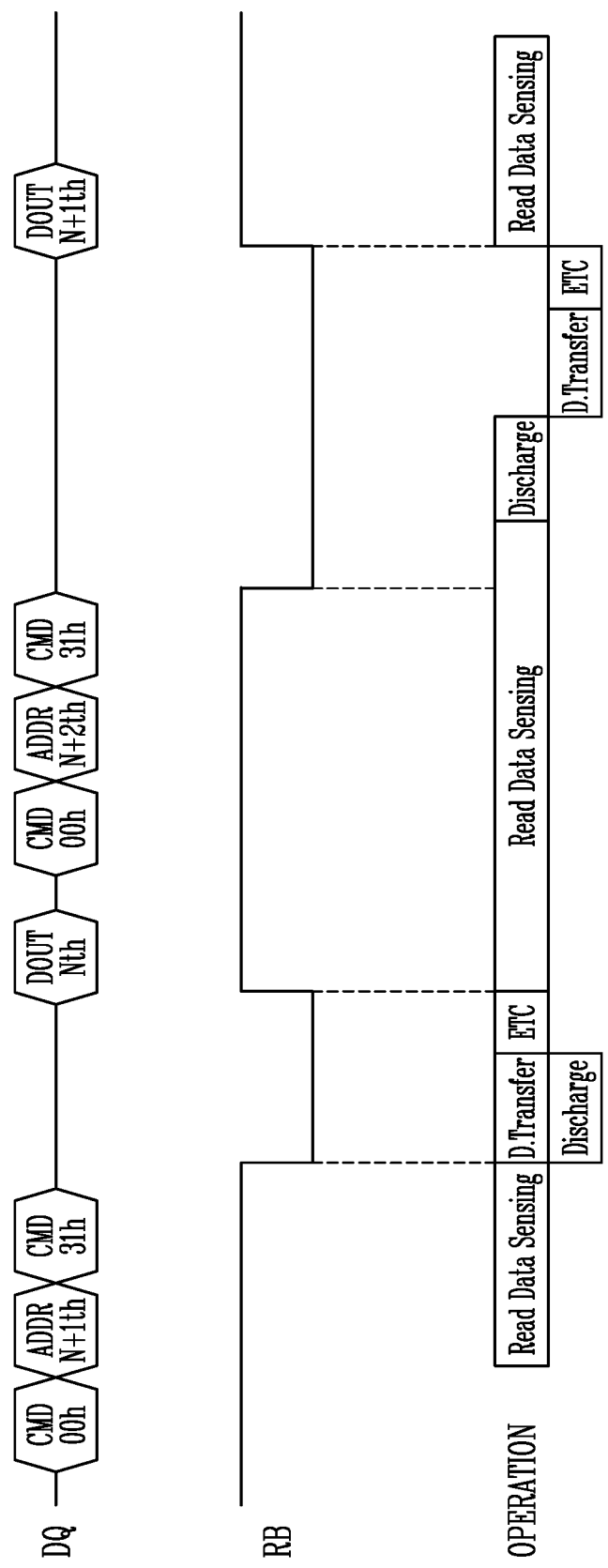
FIG. 7 is a diagram illustrating a cache read operation.

FIG. 7 is a diagram illustrating a cache read operation.

Referring to FIGS. 4 and 7, FIG. 7 illustrates a command and an address that are input through an input/output lines and data that is output through the input/output lines. Also, FIG. 7 illustrates a ready busy signal output through a ready busy line and an operation performed on a memory device in response to the ready busy signal.

In an embodiment, during a cache read operation, a command and an address may be input from a memory controller through the input/output lines DQ. During the cache read operation, a command 00h ("CMD 00h"), an N+1th address ("ADDR N+1th"), and a command 31h ("CMD 31h") are sequentially input through the input/output lines DQ. Unlike the normal read operation of FIG. 5, after the command 00h ("CMD 00h"), the command 31h ("CMD 31h") other than a command 30h ("CMD 30h") is input.

In an embodiment, before the command 31h ("CMD 31h") is input, data corresponding to an Nth address ("ADDR Nth") may be sensed ("Read Data Sensing"). The Nth address ("ADDR Nth") may be an address received before the N+1th address ("ADDR N+1th") is received.

When all of the data corresponding to the Nth address ("ADDR Nth") is stored in the main latch, the data stored in the main latch may be transferred to the cache latch ("D.Transfer"). Here, a discharge operation may be performed simultaneously with the data transfer operation. That is, since data is not yet stored in the cache latch, the operation identical to the normal read operation may be performed on the memory device until data is stored in the cache latch.

When all of the data stored in the main latch is stored in the cache latch ("D.Transfer"), and a discharge operation ("Discharge") is completed, the memory device may perform an additional operation ("ETC") such as the change of the address.

Thereafter, the memory device may output data corresponding to the Nth address ("ADDR Nth"), stored in the cache latch, through the input/output lines DQ ("DOUT Nth") while sensing data corresponding to the N+1th address ("ADDR N+1th") ("Read Data Sensing"). Unlike the normal read operation of FIG. 5, during the cache read operation, the storage of data in the main latch and the output of the data stored in the cache latch are simultaneously performed, and thus the data stored in the cache latch may be output to the memory controller at the same time that data corresponding to the N+1th address ("ADDR N+1th") is stored in the main latch.

In an embodiment, when the data corresponding to the Nth address ("ADDR Nth") is output, the memory device may receive a next read command and a next address from the memory controller through the input/output lines DQ. For example, after data corresponding to the Nth address ("ADDR Nth") has been output, the memory device may receive a command 00h ("CMD 00h"), an N+2th address ("ADDR N+2th"), and a command 31h ("CMD 31h") through the input/output lines DQ.

When all of the data corresponding to the N+1th address ("ADDR N+1th") is stored in the main latch after the command 31h ("CMD 31h") has been received, a discharge operation ("Discharge") may be performed. Here, the data stored in the main latch cannot be transferred simultaneously with the discharge operation to the cache latch. The reason for this is that all of the data stored in the cache latch may not be output.

Therefore, when the discharge operation ("Discharge") is completed, it is considered that all of the data stored in the cache latch has been output, and thus the data stored in the main latch may then be transferred to the cache latch ("D.Transfer") after the discharge operation.

When all of the data stored in the main latch is stored in the cache latch, i.e., when the data transfer operation ("D.Transfer") is completed, the memory device may perform an additional operation ("ETC"), such as the change of the address.

Thereafter, the memory device may sense data corresponding to an N+2th address ("ADDR N+2th") ("Read Data Sensing") while outputting the data corresponding to the N+1th address ("ADDR N+1th"), stored in the cache latch, through the input/output lines DQ ("DOUT N+1th").

Through the above-described procedure, the memory device may perform a cache read operation.

However, the fact that the memory device has received the cache read command from the memory controller may indicate that previous data stored in the cache latch has been output. Therefore, whether data stored in the cache latch has been output may be determined based on whether the cache read command has been received. Furthermore, whether to transfer data stored in the main latch to the cache latch may be determined based on whether the cache read command has been received.

The present disclosure presents a method of transferring data stored in the main latch to the cache latch based on whether the cache read command has been received before or after a discharge operation.

Figure 8:
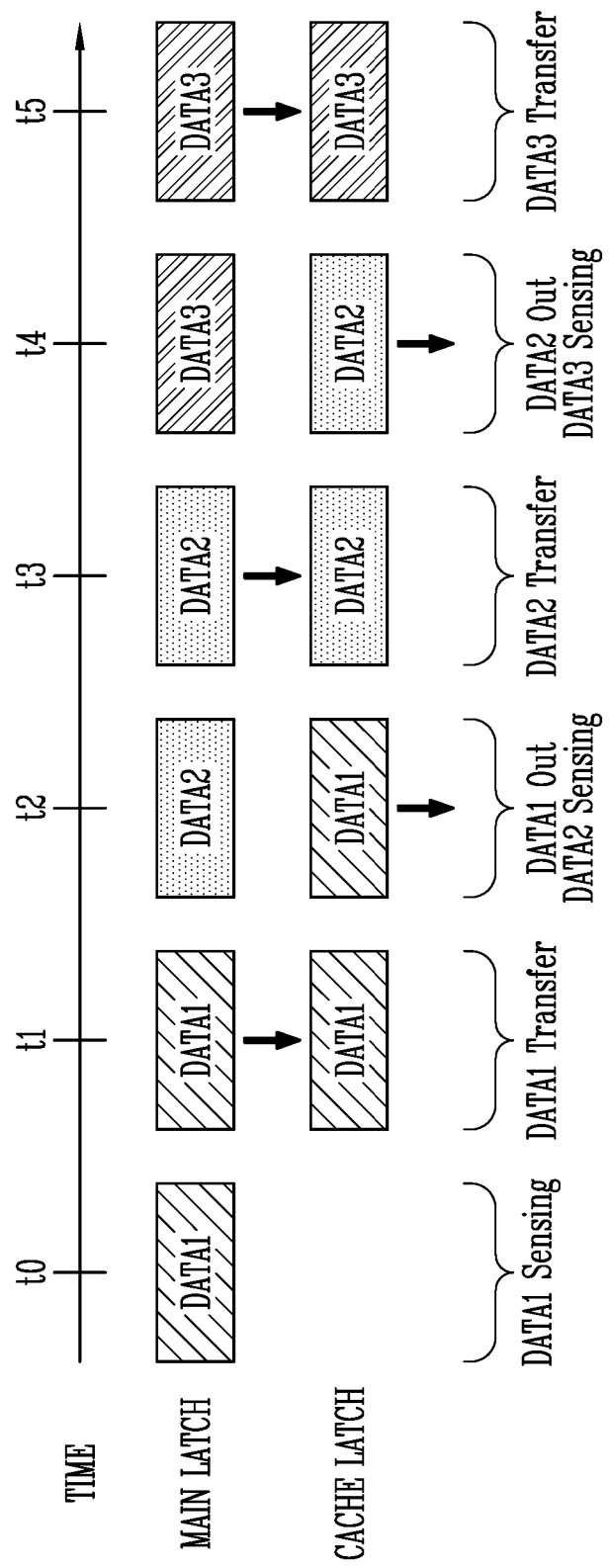
FIG. 8 is a diagram for describing the movement of data during a cache read operation.

FIG. 8 is a diagram for describing the movement of data during a cache read operation.

Referring to FIG. 8, FIG. 8 illustrates the movement of data between a main latch and a cache latch included in any one of first to nth page buffers PB1 to PBn included in a page buffer group of FIG. 2 (e.g., 123 of FIG. 2) during the cache read operation of a memory device (e.g., 100 of FIG. 2), in time sequence.

At time to, first data DATA1 corresponding to an address received together with a cache read command may be stored in the main latch. That is, the operation of sensing the first data DATA1 may be performed ("DATA1 Sensing").

When all of the first data DATA1 is stored in the main latch, the first data DATA1 stored in the main latch may be transferred to the cache latch at time t1 ("DATA1 Transfer").

In an embodiment, unlike the normal read operation described in FIG. 6, at time t2, the first data DATA1 stored in the cache latch may be output to the memory controller (e.g., 200 of FIG. 1) ("DATA1 Out") at the same time that second data DATA2 corresponding to a next read command and a next address may be sensed, and stored in the main latch ("DATA2 Sensing").

Thereafter, at time t3, the second data DATA2 stored in the main latch may be transferred to the cache latch ("DATA2 Transfer"). After all of the second data DATA2 is stored in the cache latch, at time t4, the second data DATA2 stored in the cache latch may be output to the memory controller (e.g., 200 of FIG. 1) ("DATA2 Out") at the same time that third data DATA3 corresponding to a next read command and a next address may be sensed and stored in the main latch ("DATA3 Sensing").

At time t5, the third data DATA3 stored in the main latch may be transferred to the cache latch ("DATA3 Transfer").

Through the above-described procedure, pieces of data may be successively output, and thus the time consumed in the read operation may be shortened.

Figure 9:
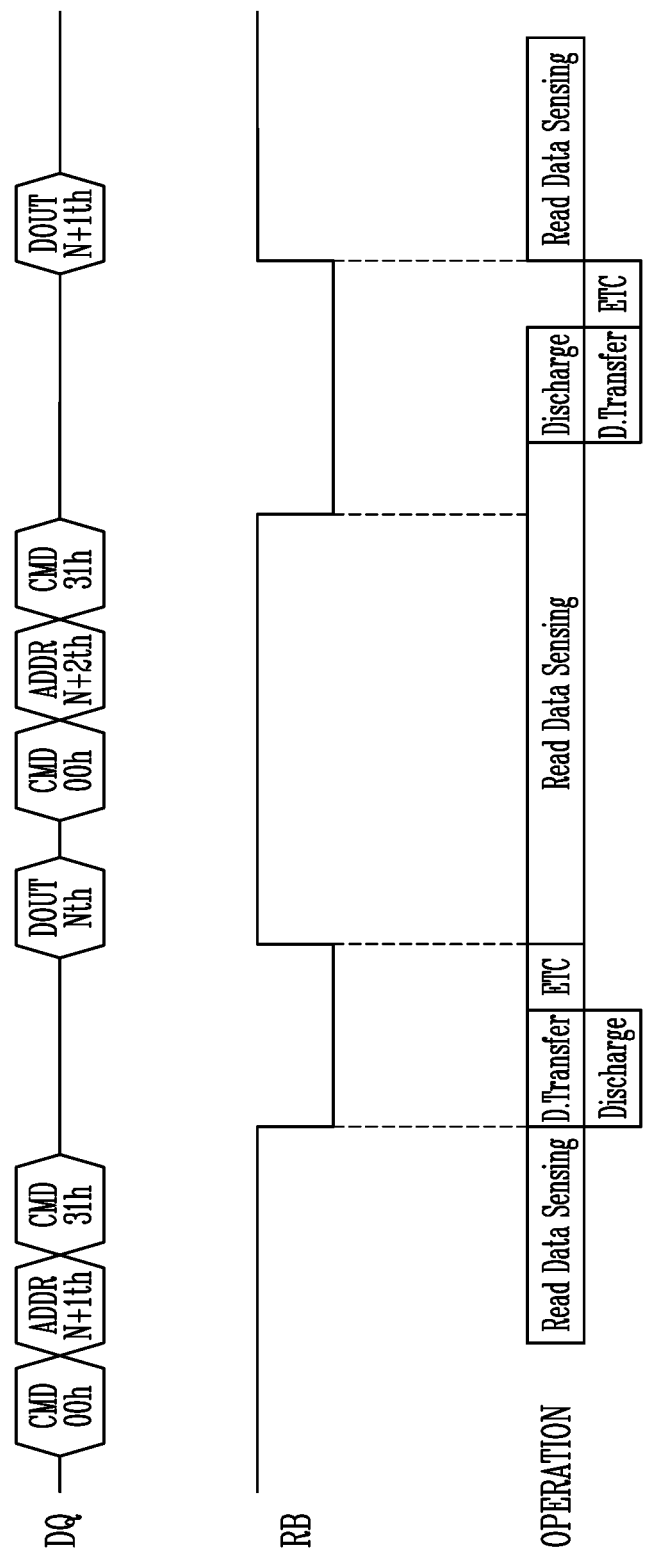
FIG. 9 is a diagram illustrating a cache read operation according to the present disclosure in which a data transfer operation is performed simultaneously with a discharge operation.

FIG. 9 is a diagram illustrating a cache read operation according to the present disclosure in which a data transfer operation is performed simultaneously with a discharge operation.

Referring to FIGS. 7 and 9, FIG. 9 illustrates an example in which, after data corresponding to an N+1th address ("ADDR N+1th") has been sensed, a discharge operation ("Discharge") and an operation of transferring data corresponding to the N+1th address ("ADDR N+1th"), stored in the main latch, to the cache latch ("D.Transfer") are simultaneously performed. That is, a control logic (e.g., 130 of FIG. 2) according to the present disclosure may control a time point at which a discharge operation is to be performed after data sensing, and a time point at which a data transfer operation between latches included in each of page buffers is to be performed, in response to a read command received from an external device.

Since the operation of FIG. 9 is the same as that of FIG. 7, except that a discharge operation ("Discharge") and an operation of transferring data corresponding to an N+1th address ("ADDR N+1th") to a cache latch ("D.Transfer") are simultaneously performed, a repeated description thereof will be omitted.

In an embodiment, the memory device (e.g., 100 of FIG. 1) may perform a discharge operation ("Discharge") after receiving a command 31h ("CMD 31h") from the memory controller (e.g., 200 of FIG. 1). Unlike a command 00h ("CMD ooh"), the command 31h ("CMD 31h") may be a command received from the memory controller (e.g., 200 of FIG. 1) when the memory device (e.g., 100 of FIG. 1) performs a cache read operation.

Also, the fact that the command 31h ("CMD 31h") has been received from the memory controller (e.g., 200 of FIG. 1) may mean that all of data stored in the cache latch has been output to the memory controller 200 and a command for outputting new read data has been received.

Therefore, in the present disclosure, when a time point at which the discharge operation is performed is the time point after the reception of the command 31h ("CMD 31h"), the memory device may perform the operation of transferring the data, stored in the main latch, to the cache latch ("D.Transfer"), simultaneously with the discharge operation ("Discharge"). That is, based on the command 31h ("CMD 31h"), after it is determined that all of the data stored in the cache latch has been output, the discharge operation ("Discharge") and the operation of transferring the data stored in the main latch to the cache latch ("D.Transfer") may be simultaneously performed.

Consequently, since the memory device (e.g., 100 of FIG. 1) may initiate the operation of transferring the data stored in the main latch to the cache latch ("D.Transfer") by advancing the time of the data transfer operation by the time consumed in the discharge operation ("Discharge"), the time consumed in the entire cache read operation may be shortened.

Figure 10:
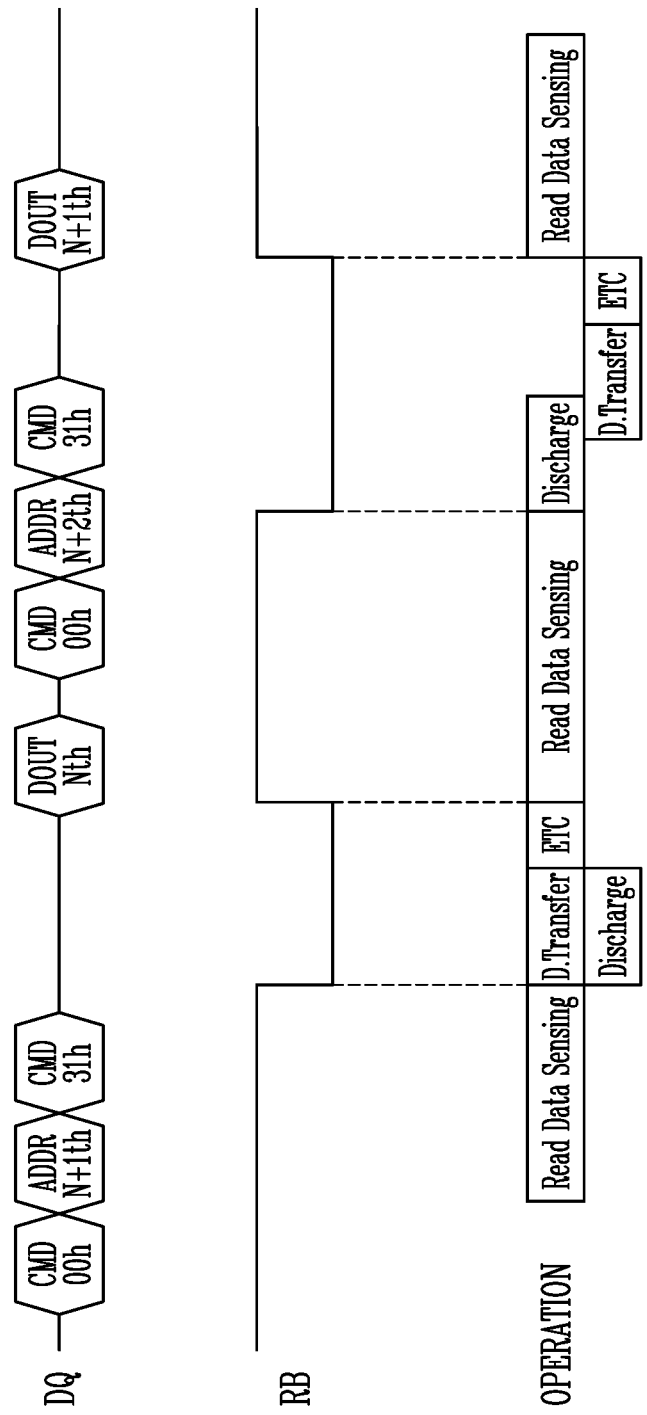
FIG. 10 is a diagram illustrating a cache read operation according to the present disclosure performed when a cache read command is received after a discharge operation.

FIG. 10 is a diagram illustrating a cache read operation according to the present disclosure performed when a cache read command is received after a discharge operation.

Referring to FIGS. 7 and 10, FIG. 10 illustrates an example in which a discharge operation ("Discharge") performed after sensing of data corresponding to an N+1th address ("ADDR N+1th") and an operation of transferring the data corresponding to the N+1th address ("ADDR N+1th"), stored in a main latch, to a cache latch ("D.Transfer") are performed at different time points. That is, a control logic (e.g., 130 of FIG. 2) according to the present disclosure may control a time point at which a discharge operation is to be performed after data sensing, and a time point at which a data transfer operation between latches included in each of page buffers is to be performed, in response to a read command received from an external device.

Since the operation of FIG. 10 is the same as that of FIG. 7, except that a discharge operation ("Discharge") is performed before a command 31h ("CMD 31h") is received, a repeated description thereof will be omitted.

In an embodiment, before the command 31h ("CMD 31h") is received from the memory controller (e.g., 200 of FIG. 1), all of the data corresponding to an N+1th address ("ADDR N+1th") is stored in the main latch, and thus the memory device (e.g., 100 of FIG. 1) may perform a discharge operation ("Discharge") before or while the command 31h ("CMD 31h") is received. Unlike a command 00h ("CMD 00h"), the command 31h ("CMD 31h") may be a command received from the memory controller (e.g., 200 of FIG. 1) when the memory device (e.g., 100 of FIG. 1) performs a cache read operation.

Unlike the operation of FIG. 9, the memory device of FIG. 10 initiates the discharge operation ("Discharge") before receiving the command 31h ("CMD 31h"), and thus the operation of transferring the data stored in the main latch to the cache latch ("D.Transfer") may be performed at a time point after the discharge operation ("Discharge") has been completed or a time point at which the command 31h ("CMD 31h") is received.

For example, when the memory device receives the command 31h ("CMD 31h") after the discharge operation ("Discharge") has been terminated, the memory device may perform the operation of transferring the data stored in the main latch to the cache latch ("D.Transfer") at a time point at which the discharge operation ("Discharge") has been completed or a time point at which the memory device receives the command 31h ("CMD 31h"). However, since the data transfer operation ("D.Transfer") is performed after the discharge operation ("Discharge") has been completed in the same manner as a conventional cache read operation, the time consumed in the read operation cannot be shortened.

For example, when the memory device receives the command 31h ("CMD 31h") while the discharge operation ("Discharge") is performed, the memory device performs the data transfer operation ("D.Transfer") at a time point at which the command 31h ("CMD 31h") is received, thus shortening the time required for the read operation. That is, a part of the discharge operation ("Discharge") overlaps the data transfer operation ("D.Transfer"), thus shortening the time required for the read operation.

Figure 11:
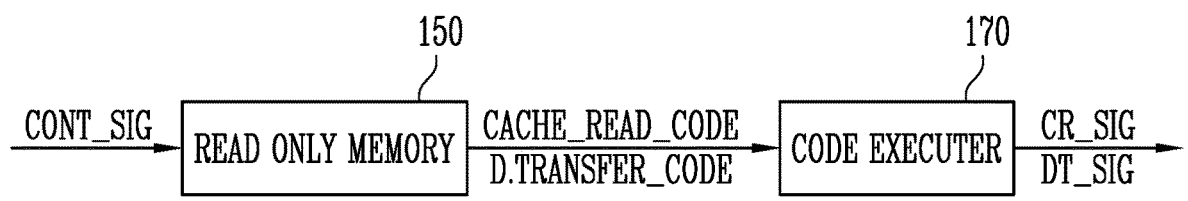
FIG. 11 is a diagram illustrating codes that are output in response to a control signal.

FIG. 11 is a diagram illustrating codes that are output in response to a control signal.

Referring to FIG. 11, FIG. 11 illustrates a read only memory 150 and a code executer 170 in the configuration of a memory device of FIG. 2 (e.g., 100 of FIG. 2). In FIG. 11, the remaining components in the configuration of the memory device of FIG. 2 (e.g., 100 of FIG. 2) are omitted.

In an embodiment, the read only memory 150 may include a plurality of codes for performing operations on the memory device (e.g., 100 of FIG. 2). The plurality of codes may include various codes including codes for performing a program operation, codes for performing a read operation, and codes for performing an erase operation.

Based on the codes stored in the read only memory 150, the program operation, the read operation, and the erase operation may be performed. For example, during the program operation, the memory device (e.g., 100 of FIG. 2) may generate a program voltage or a program inhibition voltage by executing codes stored in the read only memory 150. Alternatively, the memory device (e.g., 100 of FIG. 2) may generate a clock by executing the codes stored in the read only memory 150.

In FIG. 11, the read only memory 150 may receive a control signal CONT_SIG. The control signal CONT_SIG may be a decoded signal of a command received from the memory controller (e.g., 200 of FIG. 1) or a signal indicating the completion of the corresponding operation.

For example, during the read operation, the decoded signal of the command may be a signal obtained by decoding a normal read command or a cache read command, and the signal indicating the completion of the corresponding operation may be a signal indicating that a discharge operation has been completed.

The read only memory 150 may output a code corresponding to the control signal CONT_SIG. For example, during the read operation, when the read only memory 150 receives the control signal CONT_SIG obtained by decoding a command 31h ("CMD 31h"), among commands received from the memory controller (e.g., 200 of FIG. 1), the read only memory 150 may output a cache read code CACHE_READ_CODE. Also, during the read operation, when the read only memory 150 receives the signal indicating that the discharge operation has been completed, the read only memory 150 may output a data transfer code D.TRANSFER_CODE for transferring the data stored in a main latch to a cache latch.

Thereafter, the code executer 170 may execute the codes received from the read only memory 150. For example, when the cache read code CACHE_READ_CODE is received from the read only memory 150, the code executer 170 may output a cache read signal CR_SIG for simultaneously performing the sensing of data stored in a memory cell array and the output of data stored in the cache latch by executing the cache read code CACHE_READ_CODE. Also, when the data transfer code D.TRANSFER_CODE is received from the read only memory 150, the code executer 170 may output a data transfer signal DT_SIG for transferring data stored in the main latch to the cache latch by executing the data transfer code D.TRANSFER_CODE.

In the present disclosure, since the transfer of data may be performed at a time point at which the command 31h ("CMD 31h") is received from the memory controller (e.g., 200 of FIG. 1), the code executer 170 according to the present disclosure may output the data transfer signal DT_SIG for transferring the data stored in the main latch to the cache latch as a signal in a high state when the cache read signal CR_SIG is output as a signal in a high state.

Figure 12:
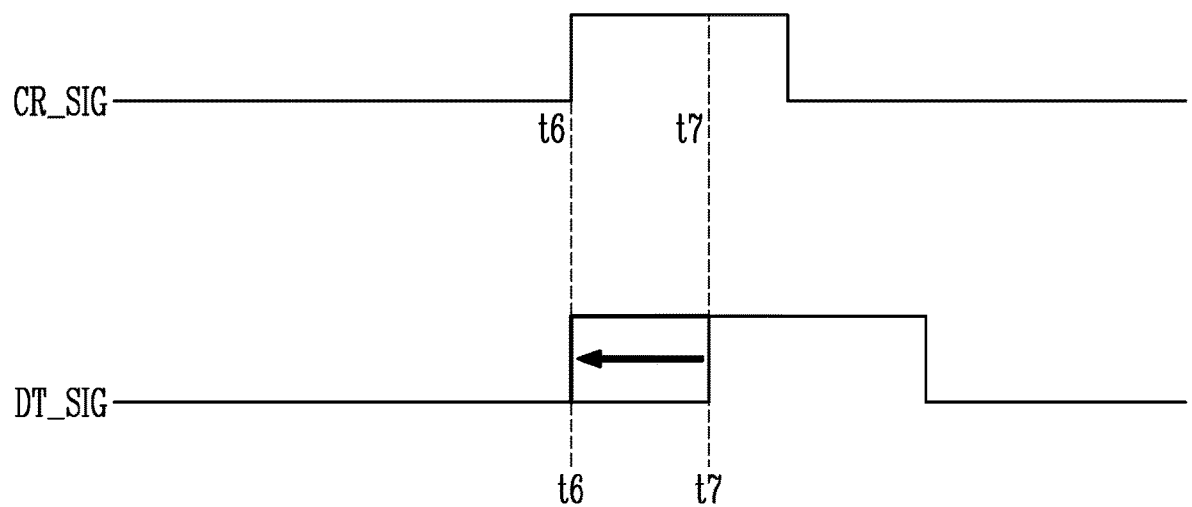
FIG. 12 is a diagram for describing a data transfer time point determined in response to a control signal.

FIG. 12 is a diagram for describing a data transfer time point determined in response to a control signal.

Referring to FIGS. 11 and 12, FIG. 12 illustrates the cache read signal CR_SIG and the data transfer signal DT_SIG of FIG. 11.

In an embodiment, the cache read signal CR_SIG may be a signal output based on a decoded signal of a cache read command received from an external device, and may be output when the memory device (e.g., 100 of FIG. 1) initiates a cache read operation. For example, when the memory device (e.g., 100 of FIG. 1) receives a command 31h ("CMD 31h") from the memory controller (e.g., 200 of FIG. 1), the cache read signal CR_SIG may be output as a signal in a high state. When the memory device (e.g., 100 of FIG. 1) terminates the cache read operation, the cache read signal CR_SIG may be output as a signal in a low state.

In an embodiment, the data transfer signal DT_SIG may be a signal that is output based on a control signal indicating that the discharge operation ("Discharge") has been completed, and may be output when data stored in a main latch is transferred to a cache latch. For example, during a read operation, when the memory device (e.g., 100 of FIG. 1) completes the discharge operation ("Discharge"), the data transfer signal DT_SIG may be output as a signal in a high state. When the memory device (e.g., 100 of FIG. 1) transfers all data to the cache latch, the data transfer signal DT_SIG may be output as a signal in a low state.

In FIG. 12, at time t6, the cache read signal CR_SIG may be output in a high state. That is, the memory device (e.g., 100 of FIG. 1) may perform a cache read operation by receiving a command 31h ("CMD 31h") from the memory controller (e.g., 200 of FIG. 1). Here, in the main latch, sensed data may be stored.

However, since, at time t6, the memory device (e.g., 100 of FIG. 1) does not yet complete the discharge operation ("Discharge"), the data stored in the main latch may not be transferred to the cache latch. That is, at time t7 at which the memory device (e.g., 100 of FIG. 1) completes the discharge operation ("Discharge") and then the data transfer signal DT_SIG makes a transition to a high state, the data stored in the main latch may be transferred to the cache latch.

In conventional technology, since the data stored in the main latch is transferred to the cache latch after the discharge operation has been completed, the memory device (e.g., 100 of FIG. 1) cannot perform a data transfer operation even if the command 31h ("CMD 31h") is received from the memory controller (e.g., 200) at time t6.

However, the fact that the command 31h ("CMD 31h") has been received from the memory controller (e.g., 200 of FIG. 1) indicates that all of the data stored in the cache latch has been output to the memory controller (e.g., 200 of FIG. 1). Thus, in the present disclosure, the memory device (e.g., 100 of FIG. 1) may output the data transfer signal DT_SIG in a high state immediately after outputting the cache read signal CR_SIG in a high state.

Therefore, since the data transfer signal DT_SIG in a high state is output together with the cache read signal CR_SIG in a high state, the memory device (e.g., 100 of FIG. 1) may transfer the data stored in the main latch to the cache latch at time t6.

Consequently, since a time point at which the data stored in the main latch is to be transferred to the cache latch may be advanced from t7 to t6, the time consumed in the read operation may be shortened.

Figure 13:
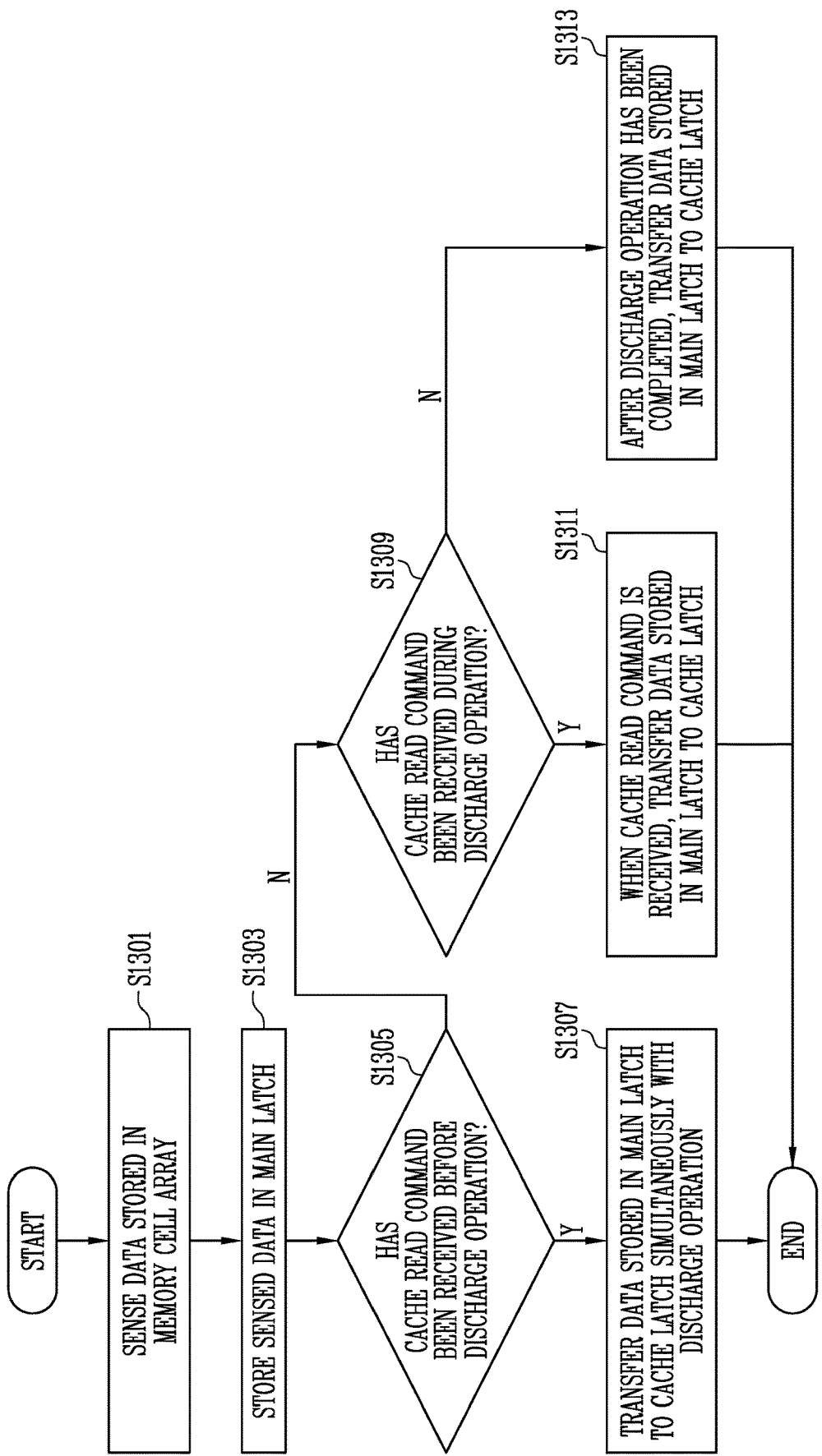
FIG. 13 is a flowchart illustrating the operation of a memory device according to an embodiment of the present disclosure.

FIG. 13 is a flowchart illustrating the operation of a memory device according to an embodiment of the present disclosure.

Referring to FIG. 13, at step S1301, during a read operation, the memory device (e.g., memory device 100 of FIG. 1) may sense data stored in a memory cell array. For example, the memory device may sense data corresponding to an address received together with a read command from a memory controller (e.g., memory controller 200 of FIG. 1).

At step S1303, the memory device may store the sensed data in a main latch. That is, the memory device may store the data sensed from the memory cell array (e.g., memory cell array 110 of FIG. 2) in the main latch, and may then transfer the data stored in the main latch to a cache latch and output the data transferred to the cache latch to the memory controller.

When the data sensed from the memory cell array is stored in the main latch, the memory device may determine whether a cache read command has been received through input/output lines DQ (e.g., input/output lines DQ of FIG. 4) before a discharge operation is performed at step S1305. Here, the cache read command received before the discharge operation is performed, may be a command 31h ("CMD 31h").

When it is determined that the memory device has received the cache read command before the discharge operation is performed (in case of Y), the data stored in the main latch may be transferred to the cache latch, simultaneously with the discharge operation at step S1307. That is, the reception of the command 31h ("CMD 31h"), which is the cache read command, may mean that all of the data stored in the cache latch has been output to the memory controller and that the data stored in the main latch may be transferred to the cache latch, and thus the memory device may transfer the data stored in the main latch to the cache latch simultaneously with the discharge operation. Consequently, the time consumed in the entire read operation may be shortened by the time consumed in the discharge operation.

However, when it is determined that the memory device has not received a cache read command before the discharge operation is performed (in case of N), the memory device may determine whether the cache read command is received during the discharge operation at step S1309.

When it is determined that the cache read command has been received during the discharge operation (in case of Y), the memory device may transfer the data stored in the main latch to the cache latch when the cache read command is received at step S1311. That is, immediately after the cache read command is received, the memory device may initiate a data transfer operation. In this case, the memory device may shorten the time consumed in the entire read operation by the time during which the discharge operation and the data transfer operation overlap each other.

However, when it is determined that the cache read command is not received during the discharge operation (in case of N), that is, when it is determined that the cache read command is received after the discharge operation has been completed, the memory device may transfer the data stored in the main latch to the cache latch after the discharge operation has been completed at step S1313. In this case, since the cache read operation is identical to the conventional cache read operation, the time consumed in the entire read operation cannot be shortened.

In addition, when a data transfer operation is not yet initiated after the discharge operation has been completed, the data stored in the main latch may be transferred to the cache latch after the cache read command has been received. That is, although the data stored in the main latch should be transferred to the cache latch after the discharge operation has been performed, when the transfer of the stored data is not yet initiated, the memory device may initiate the data transfer operation after receiving the cache read command.

Figure 14:
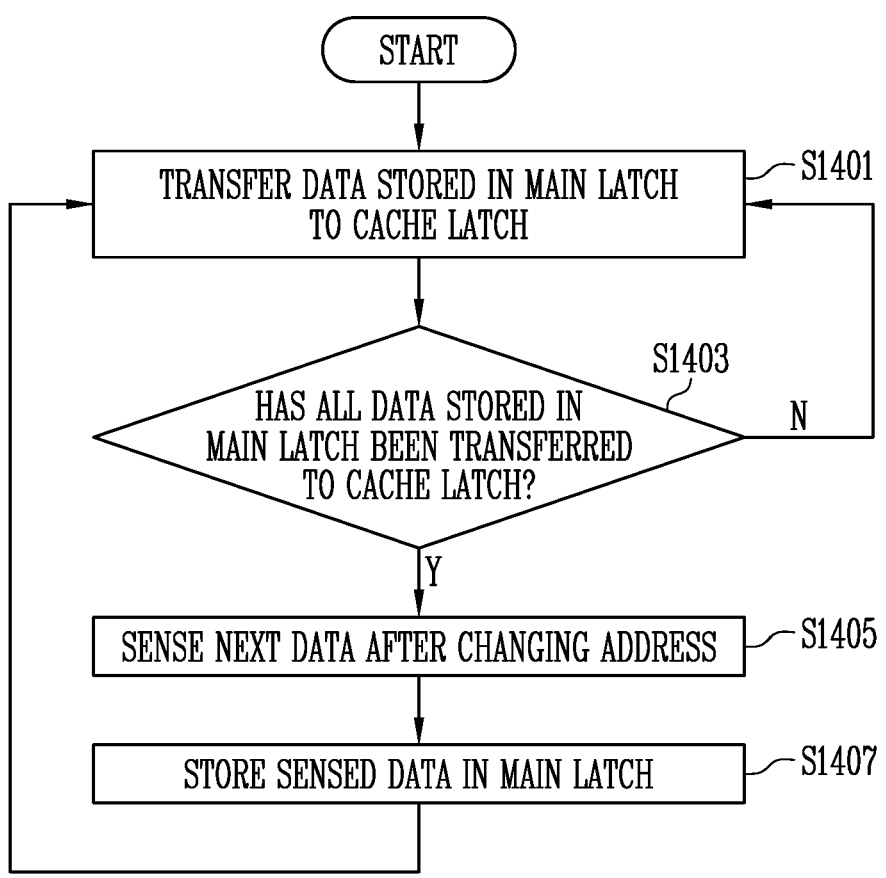
FIG. 14 is a flowchart illustrating the operation of a memory device according to an embodiment of the present disclosure.

FIG. 14 is a flowchart illustrating the operation of a memory device according to an embodiment of the present disclosure.

Referring to FIG. 14, at step S1401, the memory device (e.g., memory device 100 of FIG. 1) may transfer data stored in a main latch to a cache latch. Referring to FIG. 13, in relation with the discharge operation of the memory device, the transfer of the data stored in the main latch to the cache latch may be performed at any one of steps S1307, S1311, and S1313.

Thereafter, at step S1403, the memory device may determine whether all of the data stored in the main latch has been transferred to the cache latch. When it is determined that all of the data stored in the main latch has not yet been transferred to the cache latch (in case of N), the memory device may return to step S1401 where the data stored in the main latch may be transferred to the cache latch.

However, when it is determined that all of the data stored in the main latch has been transferred to the cache latch (in case of Y), the memory device may sense the next data after changing the address at step S1405. That is, in order to perform a read operation corresponding to the next read command, the memory device may change the address and then perform the sensing operation.

Thereafter, at step S1407, the memory device may output the data stored in the cache latch to the memory controller (e.g., memory controller 200 of FIG. 1) while storing the data sensed based on the changed address in the main latch. When all of the sensed data has been stored in the main latch, the memory device may return to step S1401 where the data stored in the main latch may be transferred to the cache latch.

Figure 15:
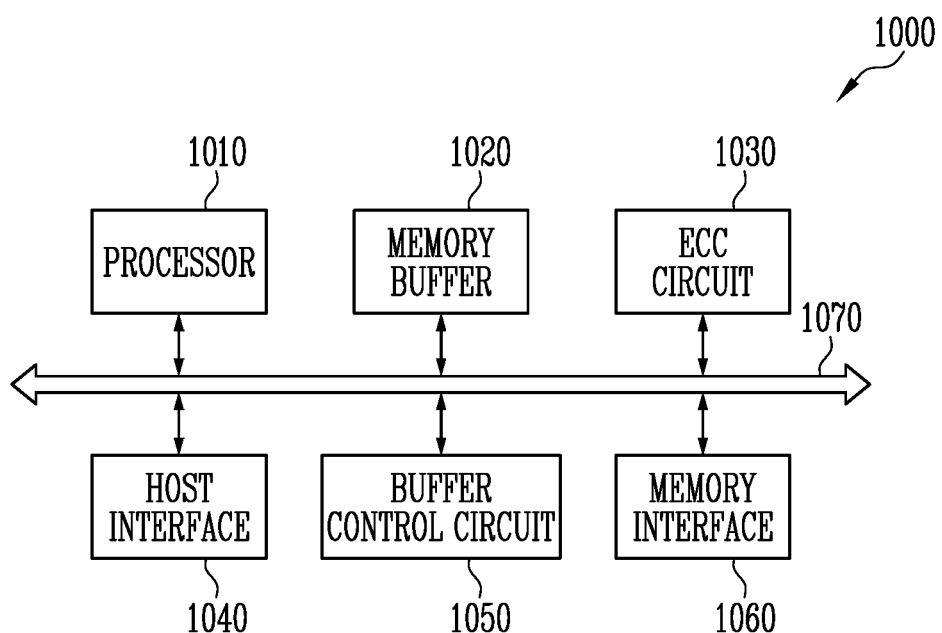
FIG. 15 is a diagram illustrating an embodiment of a memory controller of FIG. 1.

FIG. 15 is a diagram illustrating an embodiment of a memory controller of FIG. 1.

A memory controller 1000 is coupled to a host and a memory device. In response to a request received from the host, the memory controller 1000 may access the memory device. For example, the memory controller 1000 may be configured to control write, read, erase, and background operations of the memory device. The memory controller 1000 may provide an interface between the memory device and the host. The memory controller 1000 may run firmware for controlling the memory device.

Referring to FIG. 15, the memory controller 1000 may include a processor 1010, a memory buffer 1020, an error correction code (ECC) circuit 1030, a host interface 1040, a buffer control circuit 1050, a memory interface 1060, and a bus 1070.

The bus 1070 may provide channels between components of the memory controller 1000.

The processor 1010 may control the overall operation of the memory controller 1000 and may perform a logical operation. The processor 1010 may communicate with an external host through the host interface 1040 and also communicate with the memory device through the memory interface 1060. Further, the processor 1010 may communicate with the memory buffer 1020 through the buffer control circuit 1050. The processor 1010 may control the operation of the storage device by using the memory buffer 1020 as a working memory, a cache memory or a buffer memory.

The processor 1010 may perform the function of a flash translation layer (FTL). The processor 1010 may translate a logical block address (LBA), provided by the host, into a physical block address (PBA) through the FTL. The FTL may receive the LBA using a mapping table and translate the LBA into the PBA. Examples of an address mapping method performed through the FTL may include various methods according to a mapping unit. Representative address mapping methods include a page mapping method, a block mapping method, and a hybrid mapping method.

The processor 1010 may randomize data received from the host. For example, the processor 1010 may use a randomizing seed to randomize data received from the host. The randomized data may be provided, as data to be stored, to the memory device and may be programmed in the memory cell array.

The processor 1010 may run software or firmware to perform the randomizing or derandomizing operation.

In an embodiment, the processor 1010 may run software or firmware to perform randomizing and derandomizing operations.

The memory buffer 1020 may be used as a working memory, a cache memory, or a buffer memory of the processor 1010. The memory buffer 1020 may store codes and commands executed by the processor 1010. The memory buffer 1020 may store data that is processed by the processor 1010. The memory buffer 1020 may include a static RAM (SRAM) or a dynamic RAM (DRAM).

The ECC circuit 1030 may perform error correction. The ECC circuit 1030 may perform error correction code (ECC) encoding based on data to be written to the memory device through the memory interface 1060. The ECC-encoded data may be transferred to the memory device through the memory interface 1060. The ECC circuit 1030 may perform ECC decoding based on data received from the memory device through the memory interface 1060. In an example, the ECC circuit 1030 may be included as a component of the memory interface 1060.

The host interface 1040 may communicate with the external host under the control of the processor 1010. The host interface 1040 may perform communication using at least one of various communication methods such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

The buffer control circuit 1050 may control the memory buffer 1020 under the control of the processor 1010.

The memory interface 1060 may communicate with the memory device under the control of the processor 1010. The memory interface 1060 may transmit/receive commands, addresses, and data to/from the memory device through channels.

In an embodiment, the memory controller 1000 may not include the memory buffer 1020 and the buffer control circuit 1050.

In an embodiment, the processor 1010 may control the operation of the memory controller 1000 using codes. The processor 1010 may load codes from a nonvolatile memory device (e.g., ROM) provided in the memory controller 1000. In an embodiment, the processor 1010 may load codes from the memory device through the memory interface 1060.

In an embodiment, the bus 1070 of the memory controller 1000 may be divided into a control bus and a data bus. The data bus may be configured to transmit data in the memory controller 1000, and the control bus may be configured to transmit control information such as commands or addresses in the memory controller 1000. The data bus and the control bus may be isolated from each other, and may neither interfere with each other nor influence each other. The data bus may be coupled to the host interface 1040, the buffer control circuit 1050, the ECC circuit 1030, and the memory interface 1060. The control bus may be coupled to the host interface 1040, the processor 1010, the buffer control circuit 1050, the memory buffer 1020, and the memory interface 1060.

Figure 16:
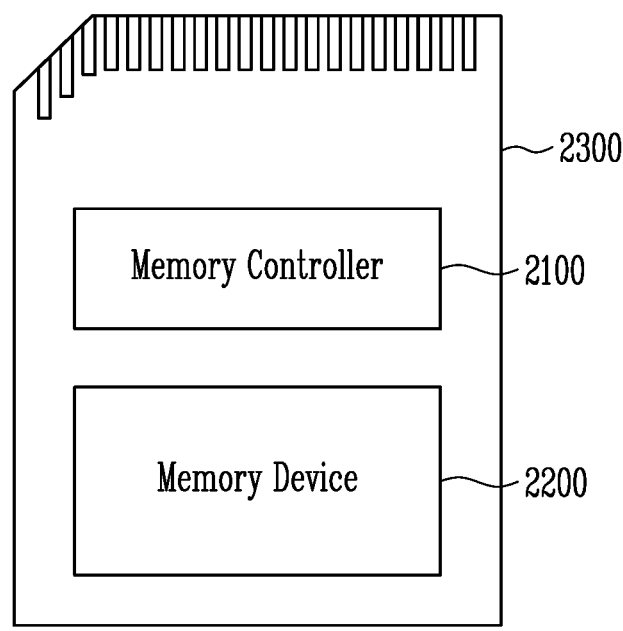
FIG. 16 is a block diagram illustrating a memory card system to which a storage device according to an embodiment of the present disclosure is applied.

FIG. 16 is a block diagram illustrating a memory card system to which the storage device according to an embodiment of the present disclosure is applied.

Referring to FIG. 16, a memory card system 2000 may include a memory controller 2100, a memory device 2200, and a connector 2300.

The memory controller 2100 is coupled to the memory device 2200. The memory controller 2100 may access the memory device 2200. For example, the memory controller 2100 may control read, write, erase, and background operations of the memory device 2200. The memory controller 2100 may provide an interface between the memory device 2200 and a host. The memory controller 2100 may run firmware for controlling the memory device 2200. The memory device 2200 may be implemented in the same way as the memory device (e.g., 100 of FIG. 2) described above with reference to FIG. 2.

In an embodiment, the memory controller 2100 may include components, such as a RAM, a processor, a host interface, a memory interface, and an ECC circuit.

The memory controller 2100 may communicate with an external device through the connector 2300. The memory controller 2100 may communicate with an external device (e.g., a host) based on a specific communication protocol. In an embodiment, the memory controller 2100 may communicate with the external device through at least one of various communication protocols such as universal serial bus (USB), multi-media card (MMC), embedded MMC (eMMC), peripheral component interconnection (PCI), PCI-express (PCI-E), advanced technology attachment (ATA), serial-ATA (SATA), parallel-ATA (PATA), small computer small interface (SCSI), enhanced small disk interface (ESDI), integrated drive electronics (IDE), Firewire, universal flash storage (UFS), Wi-Fi, Bluetooth, and nonvolatile memory express (NVMe) protocols. In an embodiment, the connector 2300 may be defined by at least one of the above-described various communication protocols.

In an embodiment, the memory device 2200 may be implemented as any of various nonvolatile memory devices, such as an Electrically Erasable and Programmable ROM (EEPROM), a NAND flash memory, a NOR flash memory, a Phase-change RAM (PRAM), a Resistive RAM (Re-RAM), a Ferroelectric RAM (FRAM), a Spin-Torque Magnetic RAM (STT-MRAM).

In an embodiment, during a cache read operation, the memory device 2200 may perform a data transfer operation of transferring data stored in a main latch to a cache latch, simultaneously with a discharge operation. Here, the memory device 2200 may determine whether to perform a data transfer operation based on whether a command 31h ("CMD 31h"), which is a cache read command, has been received from the memory controller 2100.

When it is determined that the memory device 2200 has received the command 31h ("CMD 31h") from the memory controller 2100 before the discharge operation is performed, the memory device 2200 may simultaneously perform the discharge operation and the data transfer operation. Further, when it is determined that the memory device 2200 has received the command 31h ("CMD 31h") from the memory controller 2100 during the discharge operation, the memory device 2200 may perform the data transfer operation at a time point at which the command 31h ("CMD 31h") is received.

Consequently, the time consumed in the entire read operation may be shortened by overlapping the discharge operation with the data transfer operation from the main latch to the cache latch.

The memory controller 2100 and the memory device 2200 may be integrated into a single semiconductor device to configure a memory card. For example, the memory controller 2100 and the memory device 2200 may be integrated into a single semiconductor device to configure a memory card such as a PC card (personal computer memory card international association: PCMCIA), a compact flash card (CF), a smart media card (SM or SMC), a memory stick, a multimedia card (MMC, RS-MMC, MMCmicro or eMMC), a SD card (SD, miniSD, microSD, or SDHC), or a universal flash storage (UFS).

Figure 17:
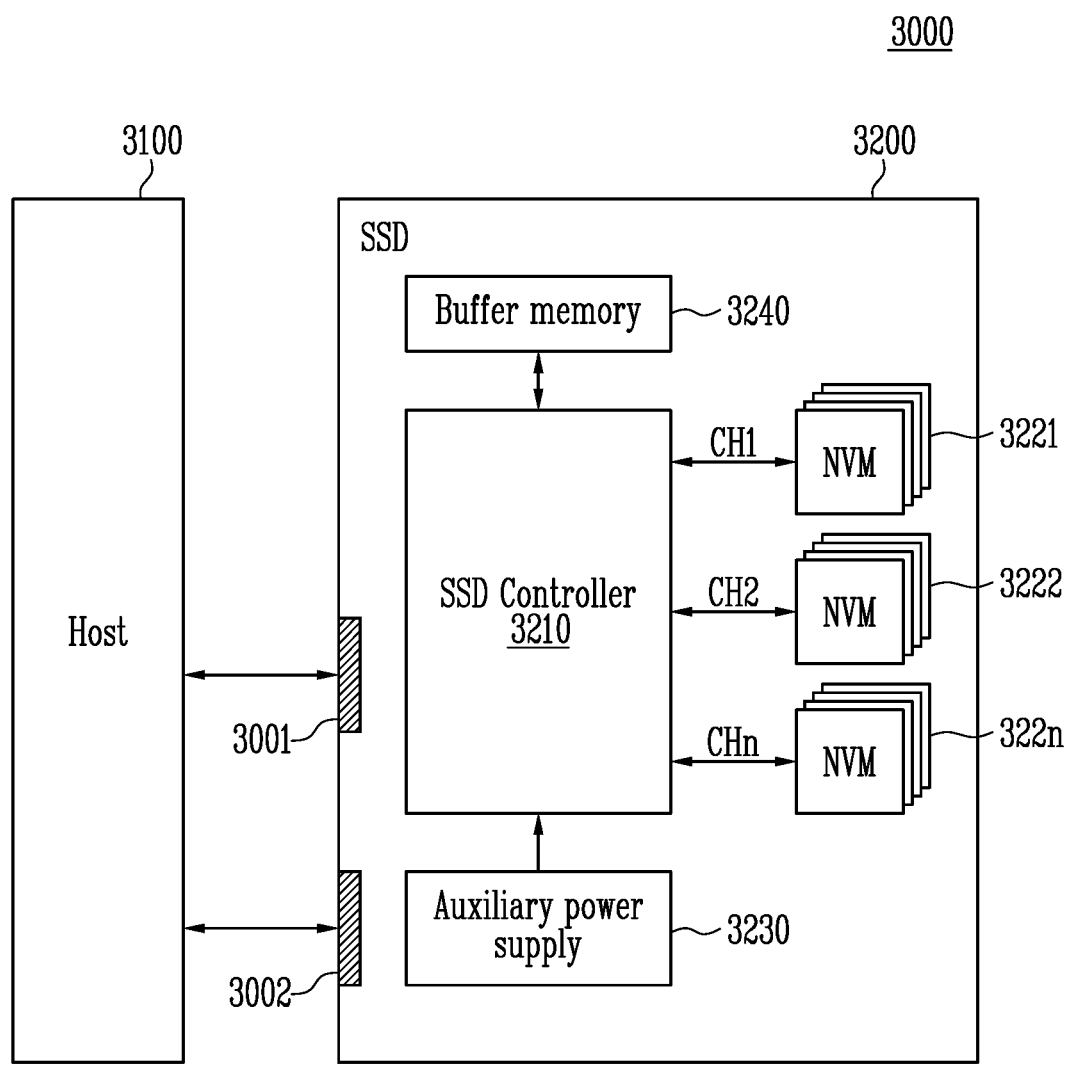
FIG. 17 is a block diagram illustrating an example of a solid state drive (SSD) system to which a storage device according to an embodiment of the present disclosure is applied.

FIG. 17 is a block diagram illustrating an example of a solid state drive (SSD) system to which the storage device according to an embodiment of the present disclosure is applied.

Referring to FIG. 17, an SSD system 3000 may include a host 3100 and an SSD 3200. The SSD 3200 may exchange signals SIG with the host 3100 through a signal connector 3001 and may receive power PWR through a power connector 3002. The SSD 3200 may include an SSD controller 3210, a plurality of flash memories 3221 to 322n, an auxiliary power supply 3230, and a buffer memory 3240.

In an embodiment, the SSD controller 3210 may perform the function of the memory controller (e.g., 200 of FIG. 1) described above with reference to FIG. 1.

The SSD controller 3210 may control the plurality of flash memories 3221 to 322n in response to the signals SIG received from the host 3100. In an embodiment, the signals SIG may be signals based on the interfaces of the host 3100 and the SSD 3200. For example, the signals SIG may be signals defined by at least one of various interfaces such as universal serial bus (USB), multi-media card (MMC), embedded MMC (eMMC), peripheral component interconnection (PCI), PCI-express (PCI-E), advanced technology attachment (ATA), serial-ATA (SATA), parallel-ATA (PATA), small computer small interface (SCSI), enhanced small disk interface (ESDI), integrated drive electronics (IDE), Firewire, universal flash storage (UFS), Wi-Fi, Bluetooth, and nonvolatile memory express (NVMe) interfaces.

In an embodiment, when the plurality of flash memories 3221 to 322n perform a cache read operation, the SSD controller 3210 may perform a data transfer operation of transferring data stored in a main latch to a cache latch, simultaneously with a discharge operation. Here, the plurality of flash memories 3221 to 322n may determine whether to perform a data transfer operation based on whether a command 31h ("CMD 31h"), which is a cache read command, has been received from the SSD controller 3210.

When the plurality of flash memories 3221 to 322n have received the command 31h ("CMD 31h") from the SSD controller 3210 before the discharge operation is performed, the plurality of flash memories 3221 to 322n may simultaneously perform the discharge operation and the data transfer operation. Also, when the plurality of flash memories 3221 to 322n have received the command 31h ("CMD 31h") from the SSD controller 3210 during the discharge operation, the plurality of flash memories 3221 to 322n may perform the data transfer operation at a time point at which the command "31h" is received.

Consequently, the time consumed in the entire read operation may be shortened by overlapping the discharge operation with the data transfer operation from the main latch to the cache latch.

The auxiliary power supply 3230 may be coupled to the host 3100 through the power connector 3002. The auxiliary power supply 3230 may be supplied with power PWR from the host 3100 and may be charged. The auxiliary power supply 3230 may supply the power of the SSD 3200 when the supply of power from the host 3100 is not smoothly performed. In an embodiment, the auxiliary power supply 3230 may be positioned inside the SSD 3200 or positioned outside the SSD 3200. For example, the auxiliary power supply 3230 may be disposed in a main board and may supply auxiliary power to the SSD 3200.

The buffer memory 3240 functions as a buffer memory of the SSD 3200. For example, the buffer memory 3240 may temporarily store data received from the host 3100 or data received from the plurality of flash memories 3221 to 322n or may temporarily store metadata (e.g., mapping tables) of the flash memories 3221 to 322n. The buffer memory 3240 may include volatile memories such as DRAM, SDRAM, DDR SDRAM, LPDDR SDRAM, and GRAM or nonvolatile memories such as FRAM, ReRAM, STT-MRAM, and PRAM.

Figure 18:
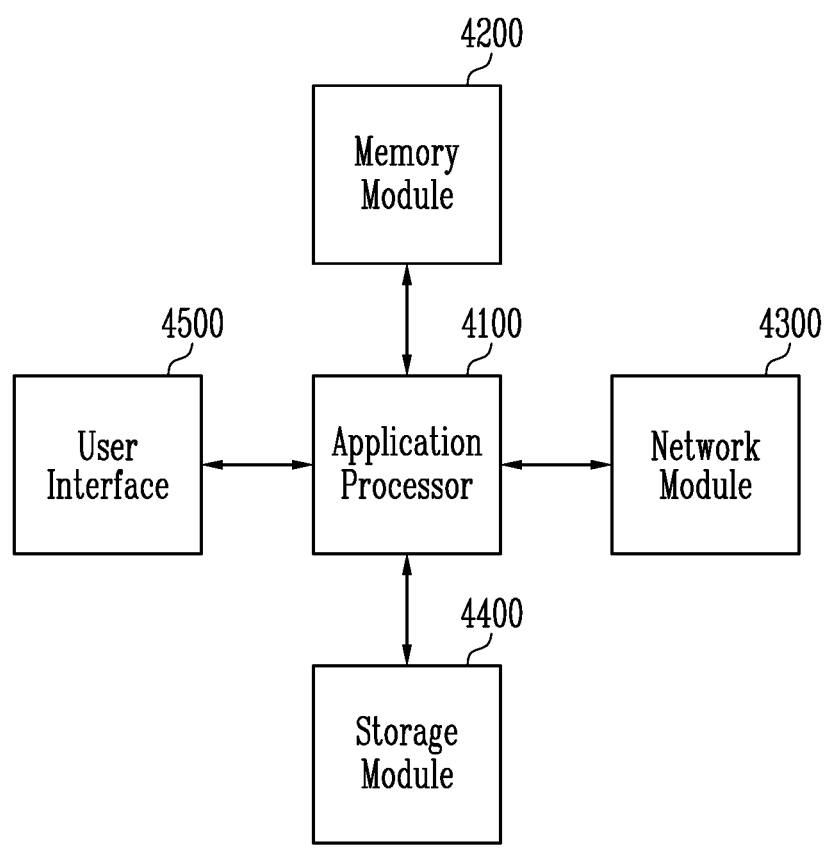
FIG. 18 is a block diagram illustrating a user system to which a storage device according to an embodiment of the present disclosure is applied.

FIG. 18 is a block diagram illustrating a user system to which the storage device according to an embodiment of the present disclosure is applied.

Referring to FIG. 18, a user system 4000 may include an application processor 4100, a memory module 4200, a network module 4300, a storage module 4400, and a user interface 4500.

The application processor 4100 may run components included in the user system 4000, an Operating System (OS) or a user program. In an embodiment, the application processor 4100 may include controllers, interfaces, graphic engines, etc. for controlling the components included in the user system 4000. The application processor 4100 may be provided as a system-on-chip (SoC).

In an embodiment, when the storage module 4400 performs a cache read operation, the application processor 4100 may perform a data transfer operation of transferring data stored in a main latch to a cache latch, simultaneously with a discharge operation. Here, the storage module 4400 may determine whether to perform a data transfer operation based on whether a command 31h ("CMD 31h"), which is a cache read command, has been received from the application processor 4100.

When the storage module 4400 has received the command 31h ("CMD 31h") from the application processor 4100 before the discharge operation is performed, the storage module 4400 may simultaneously perform the discharge operation and the data transfer operation. Further, when the storage module 4400 has received the command 31h ("CMD 31h") from the application processor 4100 during the discharge operation, the storage module 4400 may perform the data transfer operation at a time point at which the command 31h ("CMD 31h") is received.

Consequently, the time consumed in the entire read operation may be shortened by overlapping the discharge operation with the data transfer operation from the main latch to the cache latch.

The memory module 4200 may function as a main memory, a working memory, a buffer memory or a cache memory of the user system 4000. The memory module 4200 may include volatile RAMs such as DRAM, SDRAM, DDR SDRAM, DDR2 SDRAM, DDR3 SDRAM, LPDDR SDRAM, LPDDR2 SDRAM, and LPDDR3 SDRAM, or nonvolatile RAMs such as PRAM, ReRAM, MRAM, and FRAM. In an embodiment, the application processor 4100 and the memory module 4200 may be packaged based on package-on-package (POP) and may then be provided as a single semiconductor package.

The network module 4300 may communicate with external devices. For example, the network module 4300 may support wireless communication, such as Code Division Multiple Access (CDMA), Global System for Mobile communication (GSM), wideband CDMA (WCDMA), CDMA-2000, Time Division Multiple Access (TDMA), Long Term Evolution (LTE), WiMAX, WLAN, UWB, Bluetooth, or Wi-Fi communication. In an embodiment, the network module 4300 may be included in the application processor 4100.

The storage module 4400 may store data. For example, the storage module 4400 may store data received from the application processor 4100. Alternatively, the storage module 4400 may transmit the data stored in the storage module 4400 to the application processor 4100. In an embodiment, the storage module 4400 may be implemented as a nonvolatile semiconductor memory device, such as a Phase-change RAM (PRAM), a Magnetic RAM (MRAM), a Resistive RAM (RRAM), a NAND flash memory, a NOR flash memory, or a NAND flash memory having a three-dimensional (3D) structure. In an embodiment, the storage module 4400 may be provided as a removable storage medium (i.e., removable drive), such as a memory card or an external drive of the user system 4000.

In an embodiment, the storage module 4400 may include a plurality of nonvolatile memory devices, each of which may be operated in the same way as the memory device described above with reference to FIGS. 2 and 3. The storage module 4400 may be operated in the same way as the storage device 50 described above with reference to FIG. 1.

The user interface 4500 may include interfaces which input data or instructions to the application processor 4100 or output data to an external device. In an embodiment, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric device. The user interface 4500 may further include user output interfaces such as a Liquid Crystal Display (LCD), an Organic Light Emitting Diode (OLED) display device, an Active Matrix OLED (AMOLED) display device, an LED, a speaker, and a monitor.

In accordance with the present disclosure, when a next cache read command is received before a discharge operation after data stored in a memory cell array has been stored in a main latch, the discharge operation and a data transfer operation may be simultaneously performed.

Although various embodiments have been described for illustrative purposes, it will be apparent to those skilled in the art that various changes and modifications may be made without departing from the spirit and scope of the invention as defined in the following claims.

What is claimed is:

1. A memory device, comprising:
a memory cell array including a plurality of memory cells;
page buffers coupled to the memory cell array through respective bit lines; and
a control logic configured to control so that, during a read operation, data stored in the memory cell array is sensed and stored in the page buffers, and the data stored in the page buffers is output to an external device,
wherein the control logic controls a time point at which a discharge operation is to be performed after the sensing of the data, and a time point at which a data transfer operation between latches included in each of the page buffers is to be performed, in response to a read command received from the external device.

2. The memory device according to claim 1, wherein the control logic controls so that the sensed data is stored in a main latch among latches included in each of the page buffers, and so that data stored in the main latch is transferred to a cache latch and then the data stored in the cache latch is output to an external device.

3. The memory device according to claim 2, wherein the control logic controls, when the read command received from the external device is a cache read command, time points at which the discharge operation and the data transfer operation are to be performed in response to the cache read command.

4. The memory device according to claim 3, wherein the control logic controls, when the cache read command is received before the discharge operation, the time points so that the discharge operation and the data transfer operation are simultaneously performed.

5. The memory device according to claim 3, wherein the control logic controls, when the cache read command is received during the discharge operation, the time points so that the data transfer operation is performed after the cache read command has been received.

6. The memory device according to claim 3, wherein the control logic controls, when the cache read command is received after completion of the discharge operation, the time points so that the data transfer operation is performed after the discharge operation has been completed, or after the cache read command has been received.

7. The memory device according to claim 6, wherein the control logic controls, when the data transfer operation is not yet initiated after completion of the discharge operation, the time points so that the data transfer operation is performed after the cache read command has been received.

8. The memory device according to claim 3, further comprising:
a read only memory configured to store codes for performing an operation on the memory device; and
a code executer configured to execute codes output from the read only memory and generate signals based on the executed codes.

9. The memory device according to claim 8, wherein the read only memory is further configured to output, when a decoded signal of the cache read command is received, a cache read code for performing a cache read operation corresponding to the cache read command.

10. The memory device according to claim 9, wherein the read only memory is further configured to output, when a signal indicating that the discharge operation has been completed is received, a data transfer code for transferring data stored in the main latch to the cache latch.

11. The memory device according to claim 10, wherein the code executer executes the codes by outputting, when the cache read code is executed before the data transfer code is executed, a data transfer signal for initiating the data transfer operation, together with a cache read signal for initiating the cache read operation after the cache read code has been executed.

12. The memory device according to claim 10, wherein the code executer executes the codes by outputting, when the cache read code is executed after the data transfer code has been executed, a data transfer signal for initiating the data transfer operation upon the execution of the data transfer code regardless of a cache read signal for initiating the cache read operation.

13. A method of operating a memory device, the memory device including a memory cell array including a plurality of memory cells and page buffers coupled to the memory cell array through respective bit lines, the method comprising:
   sensing data stored in the memory cell array and storing sensed data in a main latch between the main latch and a cache latch included in each of the page buffers, when the memory device performs a cache read operation;
   determining, after all of the sensed data has been stored in the main latch, whether a cache read command has been received from an external device; and
   determining a time point at which a discharge operation is to be performed after the sensing of the data and a time point at which a data transfer operation of transferring the data stored in the main latch to the cache latch is to be performed, based on whether the cache read command has been received.

14. The method according to claim 13, wherein the determining of the time point includes determining, when the cache read command is received before the discharge operation, that the discharge operation and the data transfer operation are to be performed simultaneously.

15. The method according to claim 13, wherein the determining of the time point includes determining, when the cache read command is received during the discharge operation, the data transfer operation to be performed after the cache read command has been received.

16. The method according to claim 13, wherein the determining of the time point includes determining, when the cache read command is received after completion of the discharge operation, the data transfer operation to be performed after the discharge operation has been completed or after the cache read command has been received.

17. The method according to claim 16, wherein the determining of the time point includes determining, when the data transfer operation is not yet initiated after completion of the discharge operation, that the data transfer operation is to be performed after the cache read command has been received.

18. The method according to claim 13, wherein determining the time point comprises:
   outputting a code based on a decoded signal of the command received from the external device or an operation completion signal; and
   outputting a signal for determining the time point at which the data transfer operation is to be performed based on the output code.

19. The method according to claim 18, wherein the outputting of the code includes outputting, when a decoded signal of the cache read command is received, a cache read code for performing a cache read operation corresponding to the cache read command.

20. A memory device comprising:
   a memory cell array;
   a peripheral circuit suitable for discharging the memory cell array during a cache read operation;
   a main latch suitable for latching read data sensed from the memory cell array;
   a cache latch suitable for latching read data transferred from the main latch to output the read data to an external; and
   a control logic suitable for transferring the read data from the main latch to the cache latch during a discharge in response to a cache read command provided before or during the discharge.

* * * * *